US012733300B2

(12) United States Patent
Yoo et al.

(10) Patent No.: US 12,733,300 B2
(45) Date of Patent: Sep. 8, 2026

(54) LIGHT EMITTING ELEMENT AND DISPLAY DEVICE INCLUDING THE SAME

(71) Applicant: Samsung Display Co., LTD., Yongin-si (KR)

(72) Inventors: Chul Jong Yoo, Yongin-si (KR); Dae Hyun Kim, Yongin-si (KR); In Hyuk Kim, Yongin-si (KR); Dong Kyun Seo, Yongin-si (KR); Young Chul Sim, Yongin-si (KR); Tae Ha Jin, Yongin-si (KR); Hyeong Su Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 304 days.

(21) Appl. No.: 18/490,907

(22) Filed: Oct. 20, 2023

(65) Prior Publication Data

US 2024/0304760 A1 Sep. 12, 2024

(30) Foreign Application Priority Data

Mar. 9, 2023 (KR) ........................ 10-2023-0031379

(51) Int. Cl.
*H10H 20/831* (2025.01)
*H10H 20/819* (2025.01)
(Continued)

(52) U.S. Cl.
CPC ...... *H10H 20/8312* (2025.01); *H10H 20/821* (2025.01); *H10H 20/857* (2025.01); *H10W 90/00* (2026.01)

(58) Field of Classification Search
CPC .. H01L 25/0753; H10H 20/819; H10H 20/84; H10H 20/841; H10H 20/856
See application file for complete search history.

(56) References Cited

U.S. PATENT DOCUMENTS 6,667,529 B2 12/2003 Takagi
8,686,447 B2 4/2014 Tomoda et al.
(Continued)

FOREIGN PATENT DOCUMENTS

JP 2002-329937 A 11/2002
JP 2012-182276 A 9/2012
(Continued)

*Primary Examiner* — Mohsen Ahmadi
(74) *Attorney, Agent, or Firm* — Womble Bond Dickinson (US) LLP

(57) ABSTRACT

A display device includes a light emitting element disposed on a substrate and including a first end portion and a second end portion. The first electrode is electrically connected to the first end portion of the light emitting element. The second electrode is electrically connected to the second end portion of the light emitting element. A first semiconductor layer, a light emitting layer, a second semiconductor layer, and an electrode layer of the light emitting element are sequentially disposed along a longitudinal direction from the second end portion to the first end portion. An insulating film of the light emitting element covers side surfaces of the first semiconductor layer, the light emitting layer, the second semiconductor layer, and the electrode layer, and extends in parallel to the longitudinal direction. A shielding layer is disposed inside the insulating film.

19 Claims, 18 Drawing Sheets

(51) Int. Cl.

| | |
|---|---|
| ***H10H 20/821*** | (2025.01) |
| ***H10H 20/84*** | (2025.01) |
| ***H10H 20/841*** | (2025.01) |
| ***H10H 20/856*** | (2025.01) |
| ***H10H 20/857*** | (2025.01) |
| ***H10H 29/14*** | (2025.01) |
| ***H10W 90/00*** | (2026.01) |

(56) References Cited

U.S. PATENT DOCUMENTS 9,261,694 B2* 2/2016 Payne .................... G02B 26/02
10,910,512 B2 2/2021 Sung
11,158,767 B2 10/2021 Biwa et al.
11,810,905 B2 11/2023 Cho et al.
12,463,182 B2 11/2025 Min et al.
2002/0134986 A1 9/2002 Kamemura et al.
2013/0163063 A1* 6/2013 Cho ....................... G02B 26/02 216/13
2018/0062047 A1* 3/2018 Biwa .................... H10H 20/831
2020/0212262 A1* 7/2020 Jang ................... H10H 20/8312
2022/0045244 A1* 2/2022 Yoo ........................ H10H 20/84
2022/0077121 A1* 3/2022 Bae ....................... H10W 90/00
2022/0077350 A1 3/2022 Lee et al.
2022/0093828 A1 3/2022 Kwag et al.
2022/0157917 A1* 5/2022 Park ..................... H10K 59/131
2022/0208800 A1* 6/2022 Kim ....................... H10D 86/60
2022/0238756 A1 7/2022 Kang et al.
2023/0022191 A1* 1/2023 Kim ..................... H10H 20/841
2023/0032600 A1* 2/2023 Hong ................... G09G 3/3258
2023/0063356 A1* 3/2023 Tanaka ................... G01N 21/64
2023/0154937 A1* 5/2023 Lee ........................ H10D 86/60 257/91
2023/0155069 A1* 5/2023 Shin ....................... H10H 20/84 257/141
2023/0197888 A1* 6/2023 Park ..................... H10H 20/811 257/79
2023/0253413 A1* 8/2023 Basrur ..................... G09G 3/32 257/91
2023/0324795 A1* 10/2023 Hong ...................... G03F 7/032
2024/0063356 A1* 2/2024 Nam .................... H10H 20/857
2024/0072229 A1* 2/2024 Song .................... H10H 20/857
2024/0222583 A1* 7/2024 Im ........................ H10H 20/857
2024/0258360 A1* 8/2024 Park ..................... H10H 29/142
2024/0304760 A1* 9/2024 Yoo .................... H10H 20/8312
2024/0379729 A1* 11/2024 Park ..................... H10H 29/142
2025/0048865 A1* 2/2025 Lee ........................ H10K 59/40

FOREIGN PATENT DOCUMENTS

JP 2014-179455 A 9/2014
JP 2021-536134 A 12/2021
KR 10-2016-0059576 5/2016
KR 10-2017-0133347 12/2017
KR 10-1959036 3/2019
KR 10-2020-0021014 2/2020
KR 10-2020-0063380 6/2020
KR 10-2022-0031833 3/2022
KR 10-2022-0108843 8/2022
WO 2020/188851 A1 9/2020

* cited by examiner

PXL: PXL1, PXL2, PXL3

FIG. 10

ALE: ALE1, ALE2, ALE3
CF: CF1, CF2, CF3
ELT: ELT1, ELT2, ELT3
LD: LD1, LD2

LIGHT EMITTING ELEMENT AND DISPLAY DEVICE INCLUDING THE SAME

CROSS REFERENCE TO RELATED APPLICATION(S)

This application claims priority to and benefits of Korean Patent Application No. 10-2023-0031379 under 35 U.S.C. § 119, filed on, Mar. 9, 2023, the entire content of which are incorporated herein by reference.

BACKGROUND

1. Technical Field

An embodiment relates to a light emitting element and a display device including the light emitting element.

2. Description of the Related Art

Recently, interest in information display is increasing. Accordingly, research and development of display devices have been continuously conducted.

SUMMARY

Embodiments provide a light emitting element and a display device including the light emitting element capable of improving light characteristic.

However, embodiments of the disclosure are not limited to those set forth herein. The below and other embodiments will become more apparent to one of ordinary skill in the art to which the disclosure pertains by referencing the detailed description of the disclosure given.

According to an embodiment, a light emitting element may include a first semiconductor layer, a light emitting layer disposed on the first semiconductor layer, a second semiconductor layer disposed on the light emitting layer, an electrode layer disposed on the second semiconductor layer, an insulating film covering side surfaces of the first semiconductor layer, the light emitting layer, the second semiconductor layer, and the electrode layer, and a shielding layer disposed inside the insulating film.

The shielding layer may be spaced apart from the first semiconductor layer, the light emitting layer, the second semiconductor layer, and the electrode layer.

The shielding layer may surround the side surface of the light emitting layer.

A light transmittance of the shielding layer may be equal to or greater than about 70%, and light emitted from the light emitting layer may transmit through the shielding layer.

The shielding layer may include a metal, and a thickness of the shielding layer may be equal to or smaller than about 5 nm.

The shielding layer may entirely surround the side surfaces of the light emitting layer and the second semiconductor layer, and may partially surround the side surface of the first semiconductor layer, a light reflectance of the shielding layer may be equal to or greater than about 90%, and light emitted from the light emitting layer may be reflected by the shielding layer and may transmit outside the light emitting element through the first semiconductor layer and the electrode layer.

The shielding layer may include a first shielding layer surrounding the side surfaces of the second semiconductor layer and the light emitting layer, and a second shielding layer partially surrounding the side surface of the first semiconductor layer and spaced apart from the first shielding layer.

The second shielding layer may extend to an end portion of the insulating film adjacent to a lower surface of the first semiconductor layer and may be exposed outside the light emitting element, and the first shielding layer may extend to another end portion of the insulating film adjacent to an upper surface of the electrode layer and may be exposed outside the light emitting element.

According to an embodiment, a display device includes a light emitting element disposed on a substrate and including a first end portion and a second end portion arranged in a direction parallel to an upper surface of the substrate, a first electrode electrically connected to the first end portion of the light emitting element, and a second electrode electrically connected to the second end portion of the light emitting element. The light emitting element includes a first semiconductor layer, a light emitting layer, a second semiconductor layer, and an electrode layer sequentially disposed along a longitudinal direction from the second end portion to the first end portion, an insulating film covering side surfaces of the first semiconductor layer, the light emitting layer, the second semiconductor layer, and the electrode layer, parallel to the longitudinal direction, and a shielding layer disposed inside the insulating film.

The shielding layer may be spaced apart from the first semiconductor layer, the light emitting layer, the second semiconductor layer, the electrode layer, the first electrode, and the second electrode.

The shielding layer may surround the side surface of the light emitting layer, and the shielding layer may overlap the first electrode in a plan view.

A light transmittance of the shielding layer may be equal to or greater than about 70%, and light emitted from the light emitting layer may transmit through the shielding layer.

The shielding layer may include a metal, and a thickness of the shielding layer may be equal to or smaller than about 5 nm.

The shielding layer may entirely surround the side surfaces of the light emitting layer and the second semiconductor layer, and may partially surround the side surface of the first semiconductor layer, a light reflectance of the shielding layer may be equal to or greater than about 90%, and light emitted from the light emitting layer may be reflected by the shielding layer and may transmit outside the light emitting element through the first end portion and the second end portion.

The shielding layer may include a first shielding layer surrounding the side surfaces of the second semiconductor layer and the light emitting layer, and a second shielding layer partially surrounding a side surface of the first semiconductor layer and spaced apart from the first shielding layer.

The first shielding layer may extend to the first end portion and may be electrically connected to the first electrode, and the second shielding layer may extend to the second end portion and may be electrically connected to the second electrode.

According to an embodiment, a display device includes a light emitting element disposed on a first insulating layer and including a first end portion and a second end portion, a second insulating layer disposed on the light emitting element and exposing the first end portion and the second end portion of the light emitting element, a first electrode disposed on the first end portion of the light emitting element, a second electrode disposed on the second end portion of the light emitting element, and a shielding layer disposed between the second insulating layer and the light emitting element and electrically separated from the first electrode and the second electrode.

The shielding layer may be in a floating state.

A light transmittance of the shielding layer may be equal to or greater than about 70%, and light emitted from the light emitting element may transmit through the shielding layer.

The display device may further include a third insulating layer disposed between the shielding layer and the second insulating layer and covering the shielding layer.

Details of other embodiments are included in the detailed description and drawings.

The light emitting element according to an embodiment may include the shielding layer surrounding the side surfaces of the light emitting layer and the second semiconductor layer, and the shielding layer may shield or suppress an electric field formed between the light emitting element and an external configuration, e.g., formed on a side surface of the light emitting element.

The display device according to an embodiment may include the shielding layer disposed on a side surface (or a circumferential surface) of the light emitting element or between a pixel electrode and the side surface of the light emitting element, and the shielding layer may shield or suppress an electric field formed between the pixel electrode and the side surface of the light emitting element.

An effect according to an embodiment is not limited by the contents illustrated above, and more various effects are included in the description.

BRIEF DESCRIPTION OF THE DRAWINGS

The above and other features of the disclosure will become more apparent by describing in further detail embodiments thereof with reference to the accompanying drawings, in which:

FIG. 10 is a schematic cross-sectional view illustrating an embodiment of the display device of FIG. 7;

DETAILED DESCRIPTION OF THE EMBODIMENTS

Figure 1:
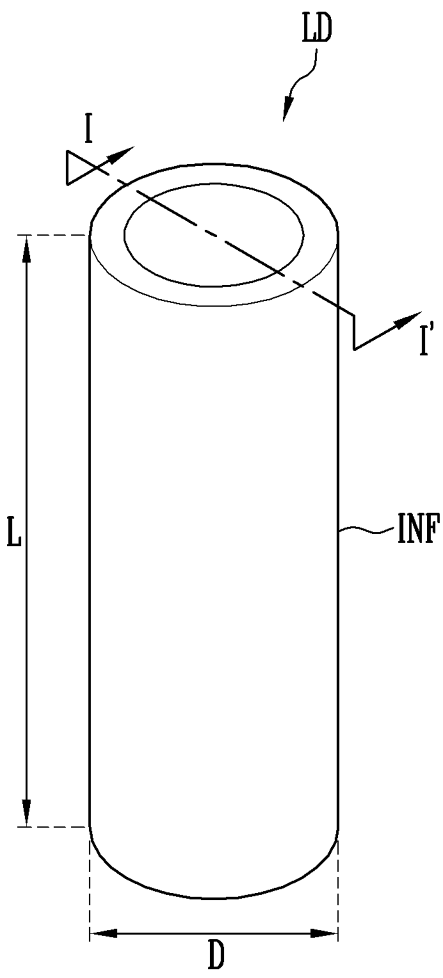
FIG. 1 is a schematic perspective view illustrating a light emitting element according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, a display device according to an embodiment is described with reference to drawings related to embodiments.

Figure 2:
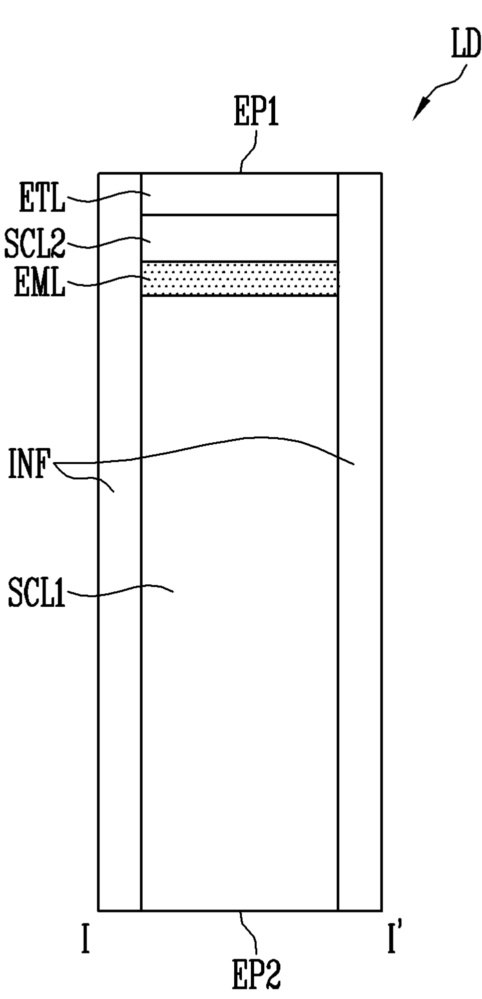
FIG. 2 is a schematic cross-sectional view illustrating an embodiment of the light emitting element of FIG. 1.

FIG. 1 is a schematic perspective view illustrating a light emitting element according to an embodiment. FIG. 2 is a schematic cross-sectional view illustrating an embodiment of the light emitting element of FIG. 1. For example, FIG. 2 illustrates an embodiment of a cross section of the light emitting element LD taken along line I-I' of FIG. 1.

Referring to FIGS. 1 and 2, the light emitting element LD may include a first semiconductor layer SCL1, a light emitting layer EML, a second semiconductor layer SCL2 and an electrode layer ETL sequentially disposed and/or stacked along a direction (for example, a length direction or a thickness direction). In an embodiment, the light emitting element LD may further include at least another semiconductor layer (for example, at least another semiconductor layer disposed on and/or under the light emitting layer EML) and/or at least one electrode layer (for example, an electrode layer disposed around the first semiconductor layer SCL1).

In an embodiment, the light emitting element LD may be formed in a rod shape. In describing an embodiment, the rod shape may include various rod-like shapes or bar-like shapes, including a circular columnar shape, a polygonal columnar shape, or the like, and a shape of a cross section thereof is not limited. In an embodiment, a length L of the light emitting element LD may be greater than a diameter D (or a width of a cross section) thereof.

In an embodiment, the light emitting element LD may have a small size of a range from a nanometer to a micrometer. For example, each light emitting element LD may have a diameter D (or a width of a cross section) and/or a length L of a range of a nanometer to a micrometer. For example, the length L of the light emitting element LD may be about 1 m to about 10 m, or about 3.5 m to about 4 m, and the diameter D of the light emitting element LD may be about 0.1 m to about 1 m, or about 500 nm to about 600 nm. However, a size of the light emitting element LD may be changed.

The light emitting element LD may include a first end portion EP1 and a second end portion EP2 facing each other. For example, the light emitting element LD may include the first end portion EP1 and the second end portion EP2 at both end portions in a longitudinal direction (or a thickness direction), respectively. The first end portion EP1 of the light emitting element LD may include a first bottom surface (for example, an upper surface) of the light emitting element LD and/or a peripheral area thereof. The second end portion EP2 of the light emitting element LD may include a second bottom surface (for example, a lower surface) of the light emitting element LD and/or a peripheral area thereof.

In an embodiment, the first semiconductor layer SCL1, the light emitting layer EML, the second semiconductor layer SCL2, and the electrode layer ETL may be sequentially disposed in a direction from the second end portion EP2 to the first end portion EP1 of the light emitting element LD. For example, the electrode layer ETL may be disposed at the first end portion EP1 of the light emitting element LD, and the first semiconductor layer SCL1 (or another electrode layer adjacent to the first semiconductor layer SCL1 and electrically connected to the first semiconductor layer SCL1) may be disposed at the second end portion EP2 of the light emitting element LD.

The light emitting element LD may further include an insulating film INF surrounding side surfaces of the first semiconductor layer SCL1, the light emitting layer EML, and the second semiconductor layer SCL2. The insulating film INF may at least partially cover a side surface of the electrode layer ETL.

The first semiconductor layer SCL1 may include a first conductivity type of semiconductor layer including a first conductivity type of dopant. For example, the first semiconductor layer SCL1 may be an n-type semiconductor layer including an n-type of dopant.

In an embodiment, the first semiconductor layer SCL1 may include a nitride-based semiconductor material or a phosphide-based semiconductor material. For example, the first semiconductor layer SCL1 may include a nitride-based semiconductor material including at least one of GaN, AlGaN, InGaN, InAlGaN, AlN, and InN, or may include a phosphide-based semiconductor material including at least one of GaP, InGaP, AlGaP, InAlGaP, AlP, and InP. In an embodiment, the first semiconductor layer SCL1 may include an n-type of dopant such as Si, Ge, or Sn. A material of the first semiconductor layer SCL1 is not limited thereto, and the first semiconductor layer SCL1 may be formed of various other materials.

The light emitting layer EML (also referred to as an "active layer") may be disposed on the first semiconductor layer SCL1. The light emitting layer EML may include a single or multiple quantum well (QW) structure. In case that a voltage equal to or greater than a threshold voltage is applied to the both end portions of the light emitting element LD, light may be emitted in case that an electron-hole pair recombines in the light emitting layer EML.

In an embodiment, the light emitting layer EML may emit light of a visible light wavelength band, for example, light of a wavelength band of about 400 nm to 900 nm. For example, the light emitting layer EML may emit blue light having a wavelength of a range of about 450 nm to 480 nm, green light having a wavelength of a range of about 480 nm to 560 nm, or red light having a wavelength of a range of about 620 nm to 750 nm. For example, a color and/or a wavelength band of light generated from the light emitting layer EML may be changed.

In an embodiment, the light emitting layer EML may include a nitride-based semiconductor material or a phosphide-based semiconductor material. For example, the light emitting layer EML may include a nitride-based semiconductor material including at least one of GaN, AlGaN, InGaN, InGaAlN, AlN, InN, and AlInN, or a phosphide-based semiconductor material including at least one of GaP, InGaP, AlGaP, InAlGaP, AlP, and InP. A material of the light emitting layer EML is not limited thereto, and the light emitting layer EML may be formed of various other materials.

In an embodiment, the light emitting layer EML may include an element involved in the color (or the wavelength band) of the light, and the color of the light generated in the light emitting layer EML may be controlled by adjusting a content and/or a composition ratio of the element. For example, the light emitting layer EML may be formed as multiple layers of a structure in which a GaN layer and an InGaN layer are alternately or repeatedly stacked with each other, and may emit light of a specific color according to a content and/or a composition ratio of indium (In) included in the InGaN layer. Therefore, the light emitting element LD of a certain color may be manufactured by adjusting the content and/or the composition ratio of indium (In) included in the light emitting layer EML.

The second semiconductor layer SCL2 may be disposed on the light emitting layer EML. The second semiconductor layer SCL2 may include a second conductivity type of semiconductor layer including a second conductivity type of dopant. For example, the second semiconductor layer SCL2 may be a p-type semiconductor layer including a p-type of dopant.

In an embodiment, the second semiconductor layer SCL2 may include a nitride-based semiconductor material or a phosphide-based semiconductor material. For example, the second semiconductor layer SCL2 may include a nitride-based semiconductor material including at least one of GaN, AlGaN, InGaN, InGaAlN, AlN, InN, and AlInN, or a phosphide-based semiconductor material including at least one of GaP, InGaP, AlGaP, InAlGaP, AlP, and InP. In an embodiment, the second semiconductor layer SCL2 may include a p-type of dopant such as Mg. A material of the second semiconductor layer SCL2 is not limited thereto, and the second semiconductor layer SCL2 may be formed of various other materials.

In an embodiment, the first semiconductor layer SCL1 and the second semiconductor layer SCL2 may include the same semiconductor material, and may include dopants of different conductivity types. In another example, the first semiconductor layer SCL1 and the second semiconductor layer SCL2 may include different semiconductor materials and may include dopants of different conductivity types.

In an embodiment, the first semiconductor layer SCL1 and the second semiconductor layer SCL2 may have different lengths (or thicknesses) in the length direction of the light emitting element LD. For example, the first semiconductor layer SCL1 may have a length longer (or a thickness thicker) than that of the second semiconductor layer SCL2 in the length direction of the light emitting element LD. Accordingly, the light emitting layer EML may be positioned to be closer to the first end portion EP1 (for example, the p-type end portion) than the second end portion EP2 (for example, an n-type end portion).

The electrode layer ETL may be disposed on the second semiconductor layer SCL2. For example, the electrode layer ETL may be formed (e.g., directly formed) on the second semiconductor layer SCL2 to contact the second semiconductor layer SCL2.

The electrode layer ETL may form an electrode for protecting the second semiconductor layer SCL2 and smoothly connecting the second semiconductor layer SCL2 to a certain electrode, line, or the like. For example, the electrode layer ETL may be an Ohmic contact electrode or a Schottky contact electrode.

In an embodiment, the electrode layer ETL may include a metal or a metal oxide. For example, the electrode layer ETL may be formed of a metal such as chromium (Cr), titanium (Ti), aluminum (Al), gold (Au), nickel (Ni), or copper (Cu), an oxide or an alloy thereof, a transparent conductive material such as indium tin oxide (ITO), indium zinc oxide (IZO), indium tin zinc oxide (ITZO), zinc oxide (ZnO), tin dioxide ($SnO_2$), or indium oxide ($In_2O_3$), and the like alone or in combination. A material of the electrode layer ETL is not limited thereto, and the electrode layer ETL may be formed of various other conductive materials.

In an embodiment, the electrode layer ETL may be substantially transparent. Accordingly, light generated from the light emitting element LD may pass through the electrode layer ETL and may be emitted from the first end portion EP1 of the light emitting element LD.

In an embodiment, the electrode layer ETL may have a thickness of a range of about 100 nm to about 200 nm, and the thickness of the electrode layer ETL may be variously changed according to embodiments. In case that the electrode layer ETL has a relatively small thickness (for example, the thickness of the range of 100 nm to 200 nm), reduction of light emission efficiency of the light emitting element LD due to provision of the electrode layer ETL may be prevented or minimized.

The insulating film INF may be provided on a surface of the light emitting element LD to surround the side surface (or a circumferential surface) of the first semiconductor layer SCL1, the light emitting layer EML, the second semiconductor layer SCL2, and the electrode layer ETL.

In case that the insulating film INF is provided on the surface of the light emitting element LD, a short defect (or a short circuit) through the light emitting element LD may be prevented or minimized. Accordingly, electrical stability of the light emitting element LD may be ensured. For example, in case that the insulating film INF is provided on the surface of the light emitting element LD, a surface defect of the light emitting element LD may be minimized to improve lifespan and efficiency.

The insulating film INF may include a transparent insulating material. Accordingly, light generated in the light emitting layer EML may be emitted to the outside of the light emitting element LD by transmitting through the insulating film INF. For example, the insulating film INF may include at least one insulating material among silicon oxide ($SiO_x$) (for example, $SiO_2$), silicon nitride ($SiN_x$) (for example, $Si_3N_4$), aluminum oxide ($Al_xO_y$) (for example, $Al_2O_3$), titanium oxide ($Ti_xO_y$) (for example, $TiO_2$), and hafnium oxide (HfOx), or another insulating material.

The insulating film INF may be formed as a single layer or multiple layers. For example, the insulating film INF may be formed of double films.

The insulating film INF may expose the first semiconductor layer SCL1 and the second semiconductor layer SCL2 at the first end portion EP1 and the second end portion EP2 of the light emitting element LD, respectively. For example, the insulating film INF may not be provided on an upper surface of the second semiconductor layer SCL2, and thus may expose the upper surface of the second semiconductor layer SCL2 at the first end portion EP1 of the light emitting element LD. For example, the insulating film INF may not be provided on a lower surface of the first semiconductor layer SCL1 (for example, a bottom surface of the light emitting element LD), and thus may expose the lower surface of the first semiconductor layer SCL1 at the second end portion EP2 of the light emitting element LD. Accordingly, driving power and/or signal may be applied to the first end EP1 and the second end portion EP2 of the light emitting element LD by connecting the first semiconductor layer SCL1 and the second semiconductor layer SCL2 to at least one electrode, line, conductive pattern layer, and/or the like.

The insulating film INF may cover (e.g., completely cover) at least side surfaces of the light emitting layer EML and the second semiconductor layer SCL2. Accordingly, electrical stability of the light emitting element LD may be ensured, and a short defect through the light emitting element LD may be prevented or minimized. In a process of removing the insulating film INF from an upper surface of the electrode layer ETL, the insulating film INF may also be partially removed from an upper portion of the side surface of the electrode layer ETL.

A thickness, a surface profile, and/or the like of the insulating film INF may vary according to an embodiment. For example, the thickness and/or the surface profile of the insulating film INF may vary according to a process method, a process condition, a material, and/or the like applied in forming the insulating film INF. In an embodiment, in case that the insulating film INF is formed by using an atomic layer deposition (ALD) process technology or the like capable of forming a film with high step coverage, the insulating film INF may have a surface profile corresponding to a side surface shape (for example, following the side surface shape) of the first semiconductor layer SCL1, the light emitting layer EML, the second semiconductor layer SCL2, and the electrode layer ETL, and may be formed to have a generally uniform thickness.

A structure, a shape, a size, and/or a type of the light emitting element LD may be changed according to an embodiment. For example, the structure, the shape, the size, and/or the type of the light emitting element LD may be variously changed according to a design condition of a light emitting device using the light emitting element LD or a light emitting characteristic to be ensured.

The light emitting element including the light emitting element LD may be used in various types of devices requiring a light source. For example, the light emitting elements LD may be disposed in the pixel of the display device, and the light emitting elements LD may be used as a light source of the pixel. The light emitting element LD may also be used in another type of device that requires a light source, such as a lighting device.

Figure 3:
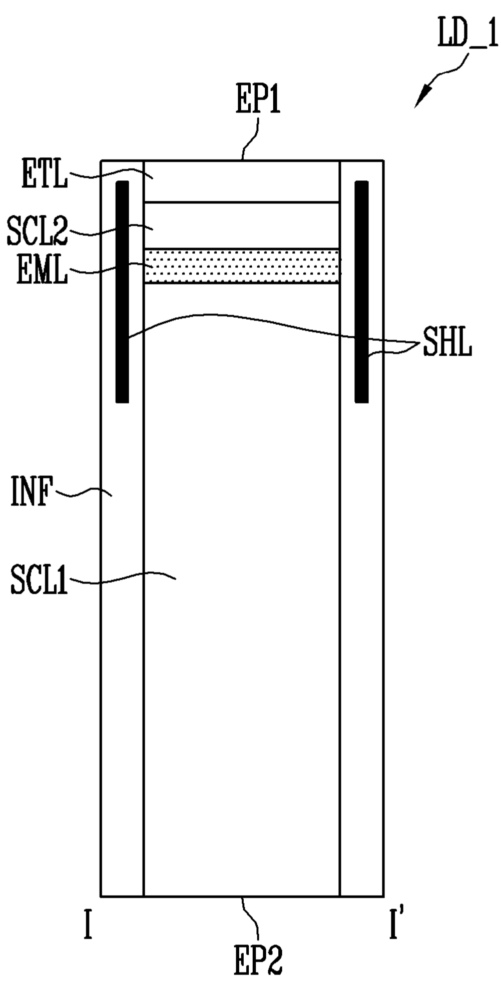
FIG. 3 is a schematic cross-sectional view illustrating an embodiment of the light emitting element of FIG. 1.
Figure 4:
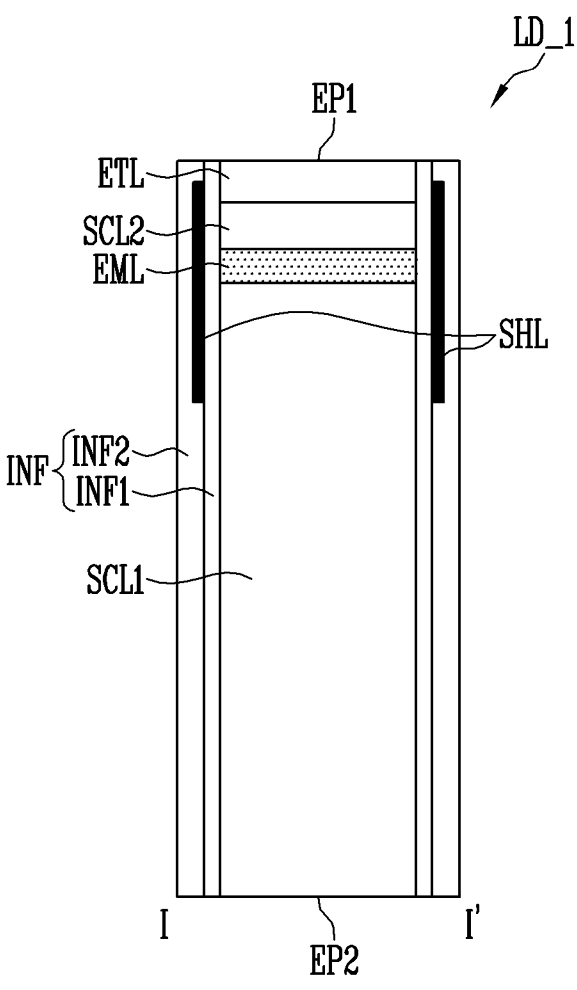
FIG. 4 is a schematic cross-sectional view illustrating an embodiment of the light emitting element of FIG. 1.

FIG. 3 is a schematic cross-sectional view illustrating an embodiment of the light emitting element of FIG. 1. FIG. 4 is a schematic cross-sectional view illustrating an embodiment of the light emitting element of FIG. 3.

Referring to FIGS. 1 to 4, the light emitting element LD_1 of FIGS. 3 and 4 may be substantially identical or similar to the light emitting element LD of FIGS. 1 and 2 except for a shielding layer SHL. Therefore, a repeated description is omitted.

The light emitting element LD_1 may further include the shielding layer SHL (or a shielding film), and the shielding layer SHL may be disposed inside the insulating film INF.

The shielding layer SHL may cover the side surface of the light emitting layer EML. For example, the shielding layer SHL may cover (e.g., completely cover) the side surface of the light emitting layer EML. The shielding layer SHL may extend or expand in a longitudinal direction of the light emitting element LD_1 to further cover the side surface of the second semiconductor layer SCL2. The shielding layer SHL may partially cover the side surface of the electrode layer ETL. For example, the shielding layer SHL may cover the side surface of the first semiconductor layer SCL1. For example, the shielding layer SHL may surround a side surface of a portion of the first semiconductor layer SCL1 adjacent to the light emitting layer EML, and may not cover a side surface of a remaining portion of the first semiconductor layer SCL1.

As will be described below with reference to FIGS. 11 and 12, the shielding layer SHL may shield or suppress an electric field formed between the light emitting element LD_1 and an external configuration, e.g., formed on a side surface of the light emitting element LD_1. In case that the light emitting element LD_1 is driven for a long period of time, an electron or a hole may be concentrated on the side surface of the light emitting element LD_1 due to the electric field, and thus a characteristic of the light emitting element LD_1 may be reduced (or deteriorated). The shielding layer SHL may shield the electric field at the side surface of the light emitting element LD_1, thereby preventing reduction (or deterioration) of the characteristic of the light emitting element LD_1 due to long-time driving.

The shielding layer SHL may be spaced apart from the first semiconductor layer SCL1, the light emitting layer EML, the second semiconductor layer SCL2, and the electrode layer ETL. For example, the shielding layer SHL may be spaced apart from the first end portion EP1 (or a first end portion or an upper surface corresponding to the first end portion EP1) and the second end portion EP2 (or a second end portion or a lower surface corresponding to the second end portion EP2). Referring to FIG. 4, for example, the insulating film INF may be formed of double films including a first insulating film INF1 and a second insulating film INF2, and the shielding layer SHL may be disposed between the first insulating film INF1 and the second insulating film INF2. The first insulating film INF1 may surround the side surfaces of the first semiconductor layer SCL1, the light emitting layer EML, the second semiconductor layer SCL2, and the electrode layer ETL, and the second insulating film INF2 may surround or cover a surface of the first insulating film INF1 and the shielding layer SHL. For example, the shielding layer SHL may also be spaced apart from an external configuration of the light emitting element LD_1, and the shielding layer SHL may be in a floating state.

The shielding layer SHL may include at least one conductive material. For example, the shielding layer SHL may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as poly(3,4-ethylenedioxythiophene) (PEDOT).

In an embodiment, a light transmittance of the shielding layer SHL may be about 70% or more. For example, light may be emitted from the light emitting layer EML to the outside of the light emitting element LD_1 through the shielding layer SHL. For example, the shielding layer SHL may include a transparent material (or a transparent conductive material), but embodiments are not limited thereto. For example, even though the shielding layer SHL including metal (for example, silver (Ag)) has a thin thickness of several nm (for example, 5 nm or less) in a width direction of the light emitting element LD_1, the shielding layer SHL may transmit light.

However, the light transmittance of the shielding layer SHL is not limited thereto. For example, in case that light emitting through the side surface of the light emitting element LD_1 is unnecessary according to a specification of a display device including the light emitting element LD_1, the light transmittance of the shielding layer SHL may be about 70% or less.

As described above, the light emitting element LD_1 may include the shielding layer SHL surrounding the side surfaces of the light emitting layer EML and the second semiconductor layer SCL2, and the shielding layer SHL may shield or suppress an electric field formed between the light emitting element LD_1 and an external configuration, e.g., formed on the side surface of the light emitting element LD_1. Therefore, reduction (or deterioration) of a characteristic of the light emitting element LD_1 due to the electric field may be prevented or minimized.

Figure 5:
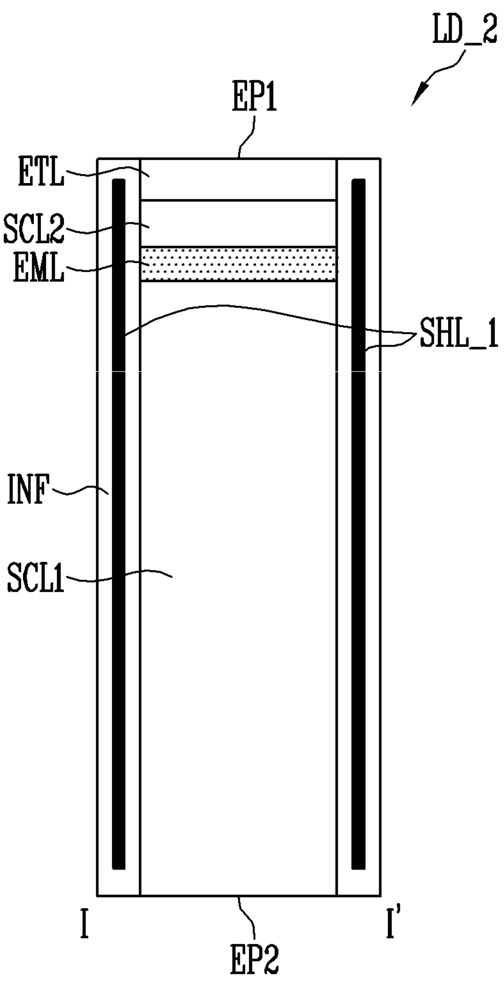
FIG. 5 is a schematic cross-sectional view illustrating an embodiment of the light emitting element of FIG. 1.

FIG. 5 is a schematic cross-sectional view illustrating an embodiment of the light emitting element of FIG. 1.

Referring to FIGS. 1 to 5, the light emitting element LD_2 of FIG. 5 may be substantially identical or similar to the light emitting element LD_1 of FIGS. 3 and 4 (or the light emitting element LD of FIGS. 1 and 2) except for a shielding layer SHL_1. Therefore, a repeated description is omitted.

The shielding layer SHL_1 may extend to the first end portion EP1 and the second end portion EP2 in a longitudinal direction of the light emitting element LD_2. The shielding layer SHL_1 may be covered by the insulating film INF (or the second insulating film INF2 of FIG. 4). For example, the shielding layer SHL_1 may not be exposed to the outside.

The shielding layer SHL_1 may cover most of the side surfaces of the first semiconductor layer SCL1, the light emitting layer EML, and the second semiconductor layer SCL2. For example, the shielding layer SHL_1 may cover (e.g., completely cover) the side surfaces of the light emitting layer EML and the second semiconductor layer SCL2, and may cover most of the first semiconductor layer SCL1. For example, the shielding layer SHL_1 may cover about 90% or more of the side surface of the first semiconductor layer SCL1. According to an embodiment, the shielding layer SHL_1 may cover the side surface of the electrode layer ETL. For example, a core shell structure of the light emitting element LD_2 may be reinforced by the shielding layer SHL_1.

In an embodiment, a light reflectance of the shielding layer SHL_1 may be about 90% or more. For example, light emitted from the light emitting layer EML may be reflected (or totally reflected) by the shielding layer SHL_1 and may proceed (or transmit) to the outside of the light emitting element LD_2 through the first end portion EP1 and the second end portion EP2 (or the first semiconductor layer SCL1 and the electrode layer ETL). For example, light emission efficiency of the light emitting element LD_2 through the first end portion EP1 and the second end portion EP2 may be improved. For example, the shielding layer SHL may include a reflective material (or a reflective conductive material).

As described above, the light emitting element LD_2 may include the shielding layer SHL_1 surrounding most of the side surface and having high reflectance, and the shielding layer SHL_1 may improve light emission efficiency of the light emitting element LD_2 through the first and second end portions EP1 and EP2.

Figure 6:
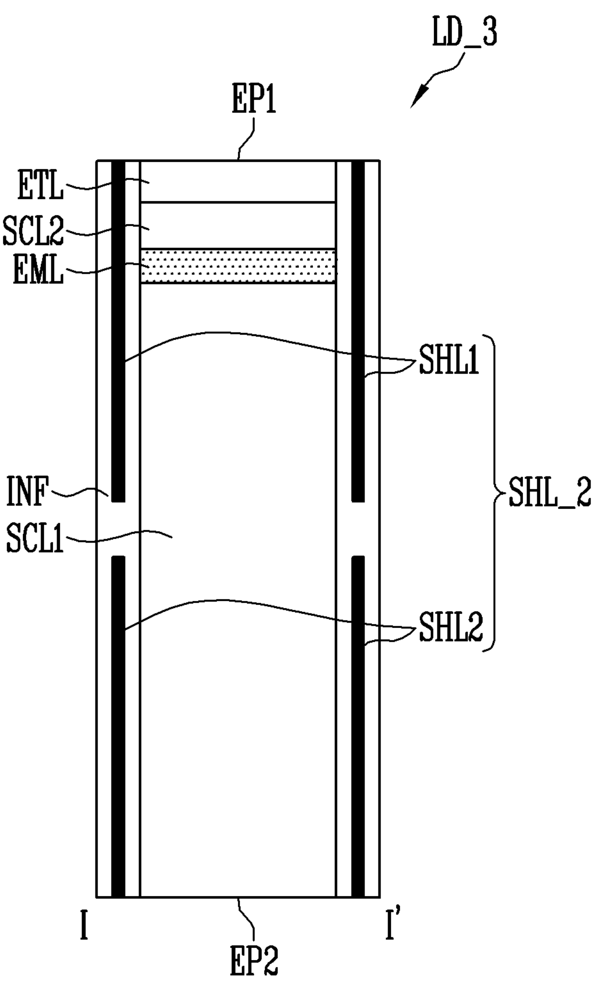
FIG. 6 is a schematic cross-sectional view illustrating an embodiment of the light emitting element of FIG. 1.

FIG. 6 is a schematic cross-sectional view illustrating an embodiment of the light emitting element of FIG. 1.

Referring to FIGS. 1 to 6, the light emitting element LD_3 of FIG. 6 may be substantially identical or similar to the light emitting element LD_2 of FIG. 5 except for the shielding layer SHL_2. Therefore, a repeated description is omitted.

The shielding layer SHL_2 may include a first shielding layer SHL1 (or a first sub-shielding layer) and a second shielding layer SHL2 (or a second sub-shielding layer) spaced apart from each other. For example, the first shielding layer SHL1 and the second shielding layer SHL2 may be disposed on the same layer between the first insulating film INF1 and the second insulating film INF2 of FIG. 4, and may be spaced apart from each other. The first shielding layer SHL1 and the second shielding layer SHL2 may be electrically independent from each other and may be electrically separated or insulated from each other.

The first shielding layer SHL1 may extend to a first end portion of the light emitting element LD_3 (e.g., an upper surface of the light emitting element LD_3 corresponding to the first end portion EP1), and may surround the side surfaces of the light emitting layer EML, the second semiconductor layer SCL2, and the electrode layer ETL. The first shielding layer SHL1 may be exposed to the outside at the first end portion EP1. For example, the first shielding layer SHL1 may contact or be connected to an external component of the light emitting element LD_3.

For example, the second shielding layer SHL2 may extend to a second end portion of the light emitting element LD_3 (e.g., a lower surface of the light emitting element LD_3 corresponding to the second end portion EP2), and may surround the side surface of the first semiconductor layer SCL1. The second shielding layer SHL2 may be exposed to the outside at the second end portion EP2. For example, the second shielding layer SHL2 may contact or be connected to an external component of the light emitting element LD_3.

For example, in case that the first shielding layer SHL1 and/or the second shielding layer SHL2 are at least selectively connected to an external component (for example, ground), the first shielding layer SHL1 and/or the second shielding layer SHL2 may shield (e.g., completely shield) an electric field. For example, the shielding layer SHL_2 may have an enhanced shielding characteristic.

In an embodiment, a light reflectance of the shielding layer SHL_2 may be about 90% or more. Therefore, light emission efficiency of the light emitting element LD_3 through the first end portion EP1 and the second end portion EP2 may be improved.

As described above, the light emitting element LD_3 may include the first shielding layer SHL1 and the second shielding layer SHL2 spaced apart from each other and surrounding most of a side surface of the light emitting element LD_3. In case that at least one of the first shielding layer SHL1 and the second shielding layer SHL2 is connected to an external component (for example, ground), an electric field formed on the side surface of the light emitting element LD_3 may be shielded more reliably.

Figure 7:
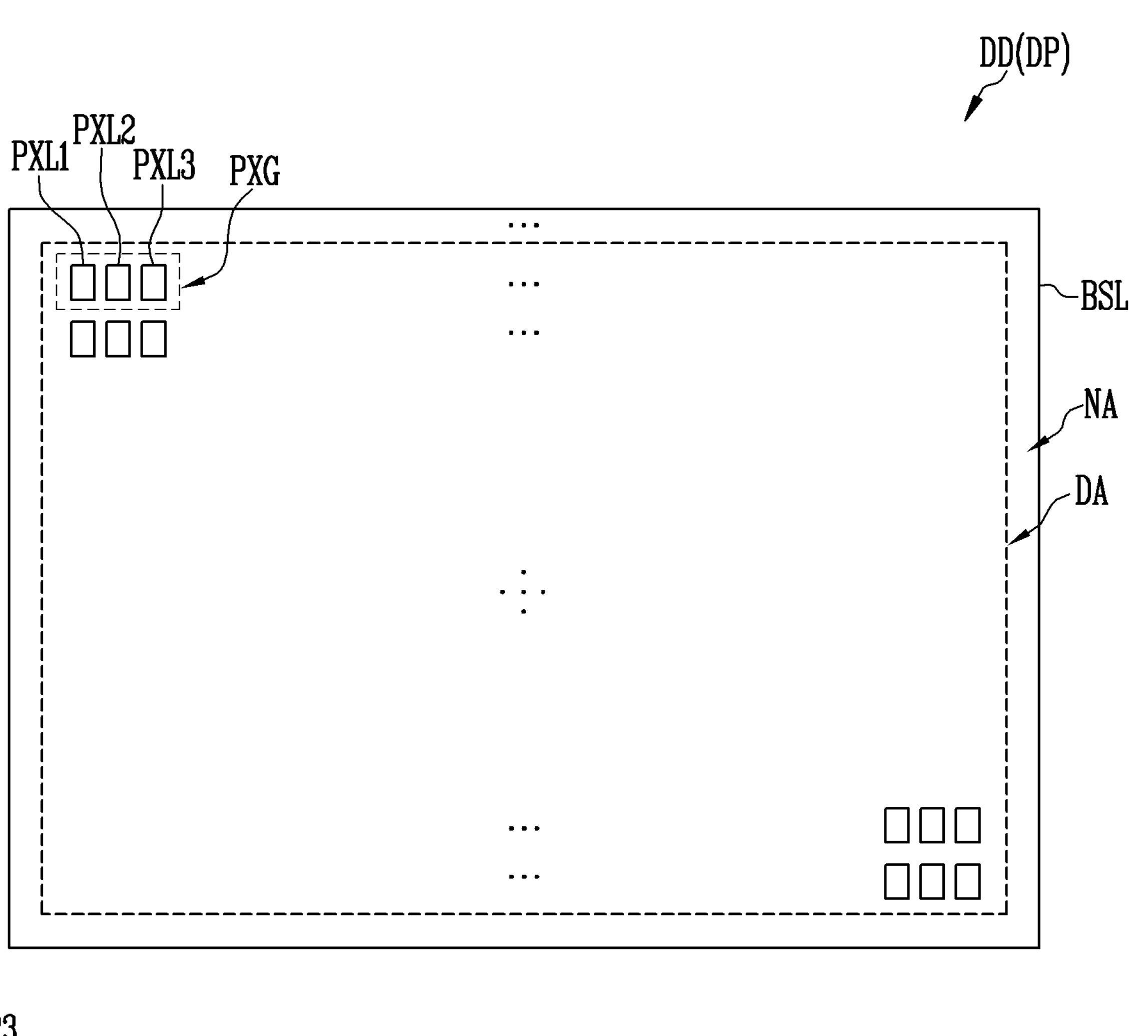
FIG. 7 is a schematic plan view illustrating a display device according to an embodiment.
Figure 7:
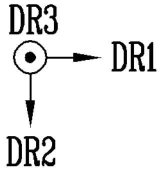

FIG. 7 is a schematic plan view illustrating a display device according to an embodiment. In FIG. 7, a structure of the display device DD is briefly shown based on a display panel DP including a display area DA. The display device DD may further include a driving circuit (for example, a scan driver, a data driver, a timing controller, and the like) for driving pixels PXL.

Referring to FIG. 7, the display device DD may include a base layer BSL (or a substrate) and the pixels PXL disposed on the base layer BSL. The base layer BSL and the display device DD including the base layer BSL may be formed in various shapes. For example, the base layer BSL and the display device DD may be formed in the form of a plate having a substantially quadrangular shape in a plan view, and may include an angled or rounded corner portion. A shape of the base layer BSL and the display device DD may be changed. For example, the base layer BSL and the display device DD may have another polygonal shape such as a hexagon or an octagon in a plan view, or may have a shape including a curved perimeter such as a circle or an ellipse.

In FIG. 7, the display device DD is shown as having a plate shape of a quadrangular shape. For example, a traverse direction (for example, a row direction or a horizontal direction) of the display device DD is defined as a first direction DR1, a height direction (for example, a column direction or a vertical direction) of the display device DD is defined as a second direction DR2, and a thickness direction (or a height direction) of the display device DD is defined as a third direction DR3.

The base layer BSL may be a base member for forming the display device DD. For example, the base layer BSL may provide a base surface of the display device DD.

The base layer BSL and the display device DD including the same may include a display area DA for displaying an image, and a non-display area NA positioned around the display area DA.

The display area DA may be an area in which the pixels PXL are disposed, and may be an area in which an image is displayed by the pixels PXL. In an embodiment, the display area DA may be disposed in a center area (for example, a center area of the display panel DP) of the base layer BSL and the display device DD.

The display area DA may have various shapes. For example, the display area DA may have various shapes including a rectangle, a circle, an ellipse, and the like. In an embodiment, the display area DA may have a shape corresponding to a shape of the base layer BSL, but embodiments are not limited thereto.

The non-display area NA may be an area except for the display area DA. In an embodiment, the non-display area NA may be disposed in an edge area of the base layer BSL and the display device DD to surround the display area DA.

The pixels PXL may be disposed in the display area DA. For example, the display area DA may include pixel areas in which each pixel PXL is provided and/or disposed.

In an embodiment, at least two types of pixels PXL for emitting light of different colors may be disposed in the display area DA. For example, in the display area DA, first color pixels PXL1, second color pixels PXL2, and third color pixels PXL3 may be arranged. At least one first color pixel PXL1, at least one second color pixel PXL2, and at least one third color pixel PXL3 disposed adjacent to each other may form a pixel group PXG. By individually controlling a luminance of the first, second, and third color pixels PXL1, PXL2, and PXL3 included in each pixel group PXG, a color of light emitted from the pixel group PXG may be variously changed.

In an embodiment, the first color pixel PXL1, the second color pixel PXL2, and the third color pixel PXL3 successively arranged along the first direction DR1 may form a pixel group PXG. For example, the number, type, mutual arrangement structure, and/or the like of the pixels PXL forming each pixel group PXG may be variously changed.

In an embodiment, the first color pixel PXL1 may be a red pixel for emitting red light, and the second color pixel PXL2 may be a green pixel for emitting green light. For example, the third color pixel PXL3 may be a blue pixel for emitting blue light. For example, the color of the light emitted from the pixels PXL forming each pixel group PXG may be variously changed.

In an embodiment, each pixel PXL may include at least one light emitting element LD. For example, the pixel PXL may include the light emitting element LD according to at least one of the embodiments of FIGS. 1 to 6. In an embodiment, each light emitting element LD may have a size of a range of a nanometer to a micrometer and have a rod shape, but embodiments are not limited thereto. For example, the number, type, structure, size, and/or the like of the light emitting elements LD provided in each pixel PXL may be changed according to an embodiment.

In an embodiment, the first color pixel PXL1, the second color pixel PXL2, and the third color pixel PXL3 may include the light emitting elements LD of a first color, a second color, and a third color as light sources, respectively. Accordingly, the first color pixel PXL1, the second color pixel PXL2, and the third color pixel PXL3 may emit light of the first color, light of the second color, and light of the third color, respectively.

In another example, the first color pixel PXL1, the second color pixel PXL2, and the third color pixel PXL3 may include the light emitting elements LD that emit light of the same color, and a light conversion layer including wavelength conversion particles (for example, particles converting a color and/or a wavelength of light such as a quantum dot (QD)) may be disposed in an emission area of the first color pixel PXL1, the second color pixel PXL2, and/or the third color pixel PXL3. Accordingly, the first color pixel PXL1, the second color pixel PXL2, and the third color pixel PXL3 may emit light of the first color, light of the second color, and light of the third color, respectively.

For example, the first color pixel PXL1, the second color pixel PXL2, and the third color pixel PXL3 may include blue light emitting elements, a light conversion layer including wavelength conversion particles of the first color (for example, a red quantum dot) may be disposed in the emission area of the first color pixel PXL1, and a light conversion layer including wavelength conversion particles of the second color (for example, a green quantum dot) may be disposed in the emission area of the second color pixel PXL2. Accordingly, the first color pixel PXL1 may emit the light of the first color (for example, red light), and the second color pixel PXL2 may emit the light of the second color (for example, green light).

The pixels PXL may have a structure according to at least one of the embodiments as described below. For example, the pixels PXL may have a structure to which any one of the embodiments to be described below is applied, or a structure to which at least two embodiments are applied in combination.

In an embodiment, the pixel PXL may be formed as an active pixel, but embodiments are not limited thereto. For example, in another example, the pixel PXL may be formed as a passive pixel.

Lines and/or a built-in circuit unit connected to the pixels PXL of the display area DA may be disposed in the non-display area NA.

In an embodiment, the non-display area NA may have a narrow width. For example, the non-display area NA may have a width of about 100 μm or less. Accordingly, the display device DD may be implemented as a bezel-less display device.

Figure 8:
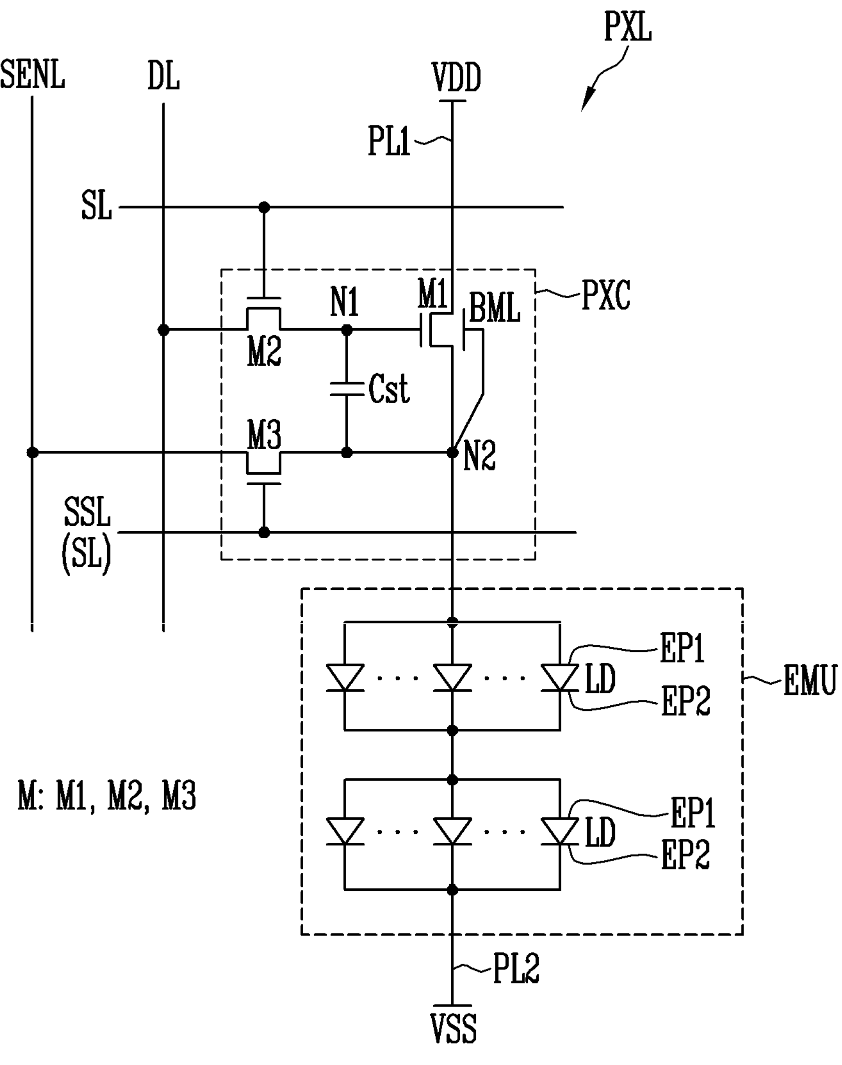
FIG. 8 is a schematic diagram of an equivalent circuit illustrating an embodiment of a pixel included in the display device of FIG. 7.

FIG. 8 is a schematic diagram of an equivalent circuit illustrating an embodiment of the pixel included in the display device of FIG. 7. Each pixel PXL shown in FIG. 8 may be any one of the pixels PXL disposed in the display area DA of FIG. 7. The pixels PXL may have structures substantially identical or similar to each other.

Referring to FIG. 8, the pixel PXL may be connected to a scan line SL (also referred to as a "first scan line"), a data line DL, a first power line PL1, and a second power line PL2. For example, the pixel PXL may be further connected to at least another power line and/or signal line. For example, the pixel PXL may be further connected to a sensing line SENL (also referred to as an "initialization power line") and/or a sensing control line SSL (also referred to as a "second scan line").

The pixel PXL may include a light emitting unit EMU that generate light of a luminance corresponding to each data signal. For example, the pixel PXL may further include a pixel circuit PXC that drives the light emitting unit EMU.

The pixel circuit PXC may be connected to the scan line SL and the data line DL, and may be connected between the first power line PL1 and the light emitting unit EMU. For example, the pixel circuit PXC may be electrically connected to the scan line SL to which a first scan signal is supplied, the data line DL to which a data signal is supplied, the first power line PL1 to which a voltage of first power VDD is applied, and the light emitting unit EMU.

The pixel circuit PXC may be selectively further connected to the sensing control line SSL to which a second scan signal is supplied, and the sensing line SENL connected to reference power (or initialization power) or a sensing circuit in response to a display period or a sensing period. In an embodiment, the second scan signal may be a signal identical to or different from the first scan signal. In case that the second scan signal is the signal identical to the first scan signal, the sensing control line SSL may be integral with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be connected between the first power line PL1 and a second node N2. The second node N2 may be a node to which the pixel circuit PXC and the light emitting unit EMU are connected. For example, the second node N2 may be a node at which an electrode (for example, a source electrode) of the first transistor M1 and the light emitting unit EMU are electrically connected to each other. A gate electrode of the first transistor M1 may be connected to a first node N1. The first transistor M1 may control a driving current supplied to the light emitting unit EMU in response to a voltage of the first node N1. For example, the first transistor M1 may be a driving transistor of the pixel PXL.

In an embodiment, the first transistor M1 may further include a lower metal layer BML (also referred to as a "back gate electrode" or a "second gate electrode"). In an embodiment, the lower metal layer BML may be connected to an electrode (for example, the source electrode) of the first transistor M1.

In an embodiment in which the first transistor M1 includes the lower metal layer BML, a back-bias technique moving a threshold voltage of the first transistor M1 in a negative direction or a positive direction by applying a back-bias voltage to the lower metal layer BML of the first transistor M1 may be applied. For example, in case that the lower metal layer BML is disposed under a semiconductor pattern layer (for example, a semiconductor pattern layer SCP of FIG. 10) forming a channel of the first transistor M1, light incident to the semiconductor pattern layer may be blocked, thereby stabilizing an operation characteristic of the first transistor M1.

The second transistor M2 may be connected between the data line DL and the first node N1. For example, a gate electrode of the second transistor M2 may be connected to the scan line SL. The second transistor M2 may be turned on in case that a first scan signal of a gate-on voltage (for example, a logic high voltage or a high level voltage) is supplied from the scan line SL, to connect the data line DL and the first node N1.

A data signal of a corresponding frame may be supplied to the data line DL for each frame period, and the data signal may be transmitted to the first node N1 through the second transistor M2 during a period in which the first scan signal of the gate-on voltage is supplied. For example, the second transistor M2 may be a switching transistor for transmitting each data signal to an inside of the pixel PXL.

A first electrode of the capacitor Cst may be connected to the first node N1, and a second electrode of the capacitor Cst may be connected to the second node N2. The capacitor Cst may be charged with a voltage corresponding to the data signal supplied to the first node N1 during each frame period.

The third transistor M3 may be connected between the second node N2 and the sensing line SENL. For example, a gate electrode of the third transistor M3 may be connected to the sensing control line SSL (or the scan line SL). The third transistor M3 may be turned on in case that a second scan signal (or a first scan signal) of a gate-on voltage (for example, a logic high voltage or a high level voltage) is supplied from the sensing control line SSL, to transmit a reference voltage (or an initialization voltage) supplied to the sensing line SENL to the second node N2 or transmit a voltage of the second node N2 to the sensing line SENL. In an embodiment, the voltage of the second node N2 may be transmitted to a sensing circuit through the sensing line SENL, and may be provided to the driving circuit (for example, the timing controller) to be used in compensation or the like of a characteristic deviation of the pixels PXL.

In FIG. 8, all of the transistors M included in the pixel circuit PXC may be N-type transistors, but embodiments are not limited thereto. For example, at least one of the first, second, and third transistors M1, M2, and M3 may be changed to a p-type transistor. A structure and a driving method of the pixel PXL may be variously changed according to embodiments.

The light emitting unit EMU may include at least one light emitting element LD. For example, the light emitting unit EMU may include the light emitting element LD according to at least one embodiment among the embodiments of FIGS. 1 to 6. In an embodiment, the light emitting unit EMU may include a single light emitting element LD connected in a forward-bias direction between first power VDD and second power VSS. In another example, the light emitting unit EMU may include light emitting elements LD connected in the forward-bias direction between the first power VDD and the second power VSS. At least one light emitting element LD connected in the forward-bias direction between the first power VDD and the second power VSS may form an effective light source of the pixel PXL.

In an embodiment, the light emitting unit EMU may include light emitting elements LD connected in parallel between the pixel circuit PXC and the second power line PL2. The first end portions EP1 of the light emitting elements LD may be electrically connected to the pixel circuit PXC and may be electrically connected to the first power line PL1 through the pixel circuit PXC. The second end portions EP2 of the light emitting elements LD may be electrically connected to the second power line PL2. A voltage of the second power VSS may be applied to the second power line PL2.

The number, type, and/or structure of the light emitting elements LD forming the effective light source of the pixel PXL may be changed according to an embodiment. For example, an arrangement and/or a connection structure of the light emitting elements LD may also be changed according to an embodiment.

In an embodiment, the light emitting unit EMU may include light emitting elements LD connected in series-parallel between the pixel circuit PXC and the second power line PL2. For example, the light emitting elements LD may be arranged in and/or connected to at least two series stages between the pixel circuit PXC and the second power line PL2, and each series stage may include at least one light emitting element LD connected in the forward-bias direction between the first power VDD and the second power VSS.

The first power VDD and the second power VSS may have different potentials. For example, the first power VDD may be high potential pixel power, and the second power VSS may be low potential pixel power. A potential difference between the first power VDD and the second power VSS may be equal to or greater than a threshold voltage of the light emitting elements LD.

The light emitting elements LD may emit light of a luminance corresponding to a driving current supplied through the pixel circuit PXC. During each frame period, the pixel circuit PXC may supply the driving current corresponding to the data signal to the light emitting unit EMU. The driving current supplied to the light emitting unit EMU may flow through the light emitting elements LD to cause the light emitting elements LD to emit light. Accordingly, the light emitting unit EMU may emit light of a luminance corresponding to the driving current.

FIG. 8 shows only the light emitting elements LD (e.g., effective light sources) connected in the forward-bias direction between the first power VDD and the second power VSS, but embodiments are not limited thereto. For example, the light emitting unit EMU may further include at least one ineffective light source in addition to the light emitting elements LD forming each effective light source. For example, the light emitting unit EMU may further include at least one ineffective light emitting element arranged in a reverse-bias direction between the first power VDD and the second power VSS or having at least one floated end portion.

Figure 9:
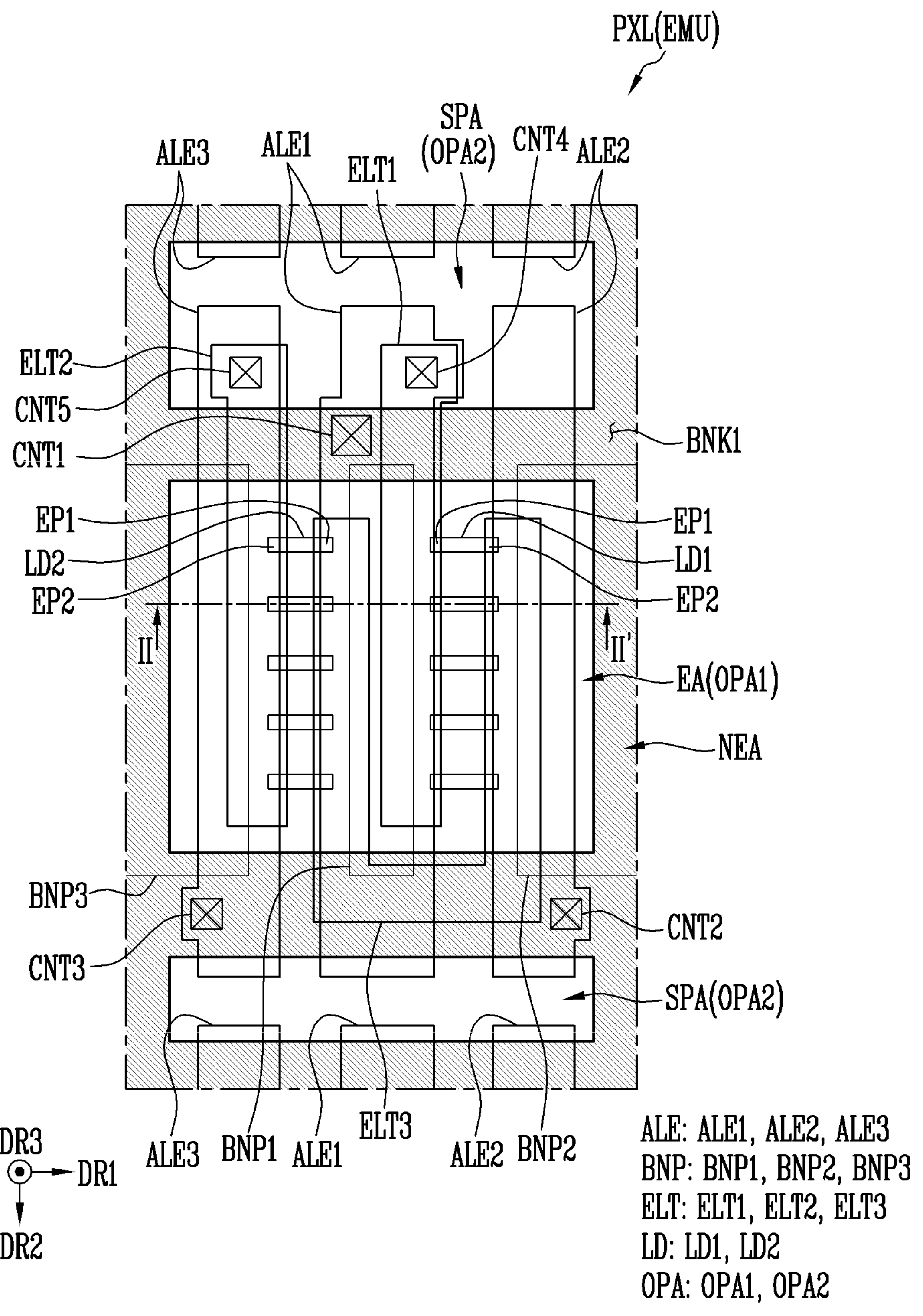
FIG. 9 is a schematic plan view illustrating an embodiment of the pixel of FIG. 8.

FIG. 9 is a schematic plan view illustrating an embodiment of the pixel of FIG. 8. In FIG. 9, a structure of the pixel PXL is shown based on the light emitting unit EMU of the pixel PXL of FIG. 8.

Referring to FIGS. 1 to 9, the pixel PXL may include an emission area EA in which at least one light emitting element LD is disposed. In an embodiment, the emission area EA may include at least two light emitting elements LD and electrodes electrically connected to the light emitting elements LD. In an embodiment, the electrodes may include alignment electrodes ALE and pixel electrodes ELT (also referred to as "contact electrodes"). For example, the pixel PXL may further include bank pattern layers BNP disposed under the alignment electrodes ALE.

The alignment electrodes ALE may have various shapes and may be spaced apart from each other. In an embodiment, the alignment electrodes ALE may be spaced apart from each other along the first direction DR1, and each of the alignment electrodes ALE may have a shape (for example, a bar shape) extending along the second direction DR2.

The shape, size, number, position, and/or mutual disposition structure of the alignment electrodes ALE may be variously changed according to embodiments. For example, the alignment electrodes ALE may have shapes and/or sizes similar to or identical to each other, or may have different shapes and sizes.

The alignment electrodes ALE may include at least two electrodes spaced apart from each other. For example, the alignment electrodes ALE may include a first alignment electrode ALE1 and a second alignment electrode ALE2, and may selectively further include a third alignment electrode ALE3.

In an embodiment, the first alignment electrode ALE1 may be positioned at a center portion of the emission area EA, and the second alignment electrode ALE2 and the third alignment electrode ALE3 may be disposed on sides (e.g., opposite sides) of the first alignment electrode ALE1. For example, the second alignment electrode ALE2 may be disposed on a right side of the first alignment electrode ALE1, and the third alignment electrode ALE3 may be disposed on a left side of the first alignment electrode ALEL.

The alignment electrodes ALE (or alignment lines before being separated into the alignment electrodes ALE of each of the pixels PXL) may receive alignment signals required for alignment of the light emitting elements LD in an alignment step of the light emitting elements LD. Accordingly, an electric field may be formed between the alignment electrodes ALE, and thus the light emitting elements LD may be aligned and/or arranged between the alignment electrodes ALE. Here, a case where the light emitting elements LD are aligned and/or arranged between the alignment electrodes ALE may mean that at least a portion of each of the light emitting elements LD is disposed between the alignment electrodes ALE.

For example, the first alignment electrode ALE1, the second alignment electrode ALE2, and the third alignment electrode ALE3 (or a first alignment line of a state in which the first alignment electrodes ALE1 of the pixels PXL are connected, a second alignment line of a state in which the second alignment electrodes ALE2 of the pixels PXL are connected, and a third alignment line of a state in which the third alignment electrodes ALE3 of the pixels PXL are connected) may receive a first alignment signal, a second alignment signal, and a third alignment signal, respectively, in the alignment step of the light emitting elements LD. The first alignment signal and the second alignment signal may have different waveforms, potentials, and/or phases. Accordingly, an electric field may be formed between the first alignment electrode ALE1 and the second alignment electrode ALE2, and thus the light emitting elements LD (for example, the first light emitting elements LD1) may be aligned between the first alignment electrode ALE1 and the second alignment electrode ALE2. The first alignment signal and the third alignment signal may have different waveforms, potentials, and/or phases from each other. Accordingly, an electric field may be formed between the first alignment electrode ALE1 and the third alignment electrode ALE3, and thus the light emitting elements LD (for example, the second light emitting elements LD2) may be aligned between the first alignment electrode ALE1 and the third alignment electrode ALE3. The third alignment signal may be a signal identical to or different from the second alignment signal.

The alignment electrodes ALE may be disposed in the emission area EA of each pixel PXL. In an embodiment, the alignment electrodes ALE may extend to a separation area SPA through a non-emission area NEA around the emission area EA. The separation area SPA may be an area where each alignment line (for example, the first alignment line, the second alignment line, or the third alignment line) is separated into the alignment electrodes ALE of the pixels PXL (for example, the first alignment electrodes ALE1, the second alignment electrodes ALE2, or the third alignment electrodes ALE3 of the pixels PXL) after the alignment of the light emitting elements LD is completed, and may be disposed on at least one side of each emission area EA.

For example, each pixel PXL may include at least one separation area SPA (for example, two separation areas SPA disposed above and below each emission area EA) disposed around the emission area EA. For example, an end portion of at least one electrode forming the light emitting unit EMU (for example, end portions of the alignment electrodes ALE) may be disposed in each separation area SPA.

In an embodiment, each alignment electrode ALE may have a separated pattern layer for each pixel PXL. For example, each of the first, second, and third alignment electrodes ALE1, ALE2, and ALE3 of each of the pixels PXL may have an individually separated pattern layer.

However, embodiments are not limited thereto. For example, in a structure in which a second pixel electrodes ELT2 of the pixels PXL are commonly connected to the second power line PL2, the alignment electrodes ALE (for example, the third alignment electrodes ALE3 of the pixels PXL) connected to the second pixel electrodes ELT2 may not be disconnected between the pixels PXL adjacent to each other along the first direction DR1 and/or the second direction DR2 and may be integral with each other.

In an embodiment, the first alignment electrode ALE1 may be electrically connected to the pixel circuit PXC (for example, the pixel circuit PXC of the corresponding pixel PXL) and/or the first power line PL1 positioned in a circuit layer (for example, the circuit layer PCL of FIG. 10) through a first contact portion CNT1. For example, the first alignment signal may be supplied to the first alignment electrode ALE1 (or the first alignment line) through at least one line (for example, the first power line PL1) positioned in the circuit layer.

The first contact portion CNT1 may include at least one contact hole and/or via hole. In an embodiment, the first contact portion CNT1 may be positioned in the non-emission area NEA positioned around each emission area EA, but a position of the first contact portion CNT1 may be changed. For example, the first contact portion CNT1 may be disposed in each emission area EA or separation area SPA.

In an embodiment, the second alignment electrode ALE2 may be electrically connected to the second power line PL2 positioned in the circuit layer through a second contact portion CNT2. For example, the second alignment signal may be supplied to the second alignment electrode ALE2 (or the second alignment line) through the second power line PL2.

For example, the third alignment electrode ALE3 may be electrically connected to the second power line PL2 positioned in the circuit layer through a third contact portion CNT3. For example, the second alignment signal may be supplied to the third alignment electrode ALE3 (or the third alignment line) through the second power line PL2.

Each of the second contact portion CNT2 and the third contact portion CNT3 may include at least one contact hole and/or via hole. In an embodiment, the second contact portion CNT2 and the third contact portion CNT3 may be positioned in the non-emission area NEA positioned around each emission area EA, but positions of the second contact portion CNT2 and the third contact portion CNT3 may be changed. For example, the second contact portion CNT2 and the third contact portion CNT3 may be disposed in each emission area EA or separation area SPA.

At least one first light emitting element LD1 may be disposed between the first alignment electrode ALE1 and the second alignment electrode ALE2. For example, first light emitting elements LD1 may be arranged between the first alignment electrode ALE1 and the second alignment electrode ALE2.

Each first light emitting element LD1 may or may not overlap the first alignment electrode ALE1 and/or the second alignment electrode ALE2. The first end portion EP1 of the first light emitting element LD1 may be disposed adjacent to the first alignment electrode ALE1, and the second end portion EP2 of the first light emitting element LD1 may be disposed adjacent to the second alignment electrode ALE2.

The first end portion EP1 of the first light emitting element LD1 may be electrically connected to a first pixel electrode ELT1. In an embodiment, the first end portion EP1 of the first light emitting element LD1 may be electrically connected to the pixel circuit PXC and/or the first power line PL1 through the first pixel electrode ELT1. For example, the first end portion EP1 of the first light emitting element LD1 may be electrically connected to the first alignment electrode ALE1 (or a bridge electrode corresponding to the first alignment electrode ALE1) through the first pixel electrode ELT1, and may be electrically connected to the pixel circuit PXC and/or the first power line PL1 through the first alignment electrode ALE1. However, embodiments are not limited thereto.

The second end portion EP2 of the first light emitting element LD1 may be electrically connected to a third pixel electrode ELT3 and/or the second pixel electrode ELT2. In an embodiment, the second end portion EP2 of the first light emitting element LD1 may be electrically connected to the third pixel electrode ELT3. For example, the second end portion EP2 of the first light emitting element LD1 may be electrically connected to the second power line PL2 via the third pixel electrode ELT3, at least one second light emitting element LD2, the second pixel electrode ELT2, and the third alignment electrode ALE3 sequentially.

At least one second light emitting element LD2 may be disposed between the first alignment electrode ALE1 and the third alignment electrode ALE3. For example, second light emitting elements LD2 may be arranged between the first alignment electrode ALE1 and the third alignment electrode ALE3.

Each second light emitting element LD2 may or may not overlap the first alignment electrode ALE1 and/or the third alignment electrode ALE3. The first end portion EP1 of the second light emitting element LD2 may be disposed adjacent to the first alignment electrode ALE1, and the second end portion EP2 of the second light emitting element LD2 may be disposed adjacent to the third alignment electrode ALE3.

The first end portion EP1 of the second light emitting element LD2 may be electrically connected to the third pixel electrode ELT3. The second end portion EP2 of the second light emitting element LD2 may be electrically connected to the second pixel electrode ELT2. In an embodiment, the second end portion EP2 of the second light emitting element LD2 may be electrically connected to the second power line PL2 through the second pixel electrode ELT2. For example, the second end portion EP2 of the second light emitting element LD2 may be electrically connected to the third alignment electrode ALE3 through the second pixel electrode ELT2, and may be electrically connected to the second power line PL2 through the third alignment electrode ALE3. However, embodiments are not limited thereto.

For example, each light emitting element LD (for example, first light emitting element LD1 or second light emitting element LD2) may include the first end portion EP1 electrically connected to the first pixel electrode ELT1 and the second end portion EP2 electrically connected to the second pixel electrode ELT2. The light emitting element LD may be the light emitting element LD according to at least one embodiment among the embodiments of FIGS. 1 to 6. The type, size, shape, structure, number, and/or the like of the light emitting elements LD forming the light emitting unit EMU may be changed.

The light emitting elements LD may be dispersed in a solution and prepared in a form of a light emitting element mixture liquid (or a light emitting element ink), and may be supplied to each emission area EA by an inkjet method, a slit coating method, or the like. In case that the alignment signals are applied to the alignment electrodes ALE (or the alignment lines) of the pixels PXL simultaneously or after supply of the light emitting elements LD, an electric field may be formed between the alignment electrodes ALE, and thus the light emitting elements LD may be aligned. After the alignment of the light emitting elements LD is completed, a solvent may be removed through a drying process or the like.

The first pixel electrode ELT1 (also referred to as a "first electrode") may be disposed on the first end portions EP1 of the first light emitting elements LD1, and may be electrically connected to the first end portions EP1 of the first light emitting elements LD1. For example, the first pixel electrode ELT1 may be disposed (e.g., directly disposed) on the first end portions EP1 of the first light emitting elements LD1 to be in contact with the first end portions EP1 of the first light emitting elements LD1.

In an embodiment, the first pixel electrode ELT1 may overlap the first alignment electrode ALE1 and may be electrically connected to the first alignment electrode ALE1 through a fourth contact portion CNT4. For example, the first pixel electrode ELT1 may be electrically connected to the pixel circuit PXC and/or the first power line PL1 through the first alignment electrode ALE1. In another example, the first pixel electrode ELT1 may be electrically connected to the pixel circuit PXC and/or the first power line PL1 without passing through the first alignment electrode ALE1.

The third pixel electrode ELT3 may be disposed on the second end portions EP2 of the first light emitting elements LD1 and the first end portions EP1 of the second light emitting elements LD2, and may be electrically connected to the second end portions EP2 of the first light emitting elements LD1 and the first end portions EP1 of the second light emitting elements LD2. For example, the third pixel electrode ELT3 may be disposed (e.g., directly disposed) on the second end portions EP2 of the first light emitting elements LD1 and the first end portions EP1 of the second light emitting elements LD2 to be in contact with the second end portions EP2 of the first light emitting elements LD1 and the first end portions EP1 of the second light emitting elements LD2. The third pixel electrode ELT3 may be an intermediate electrode for electrically connecting the first light emitting elements LD1 and the second light emitting elements LD2. In an embodiment, the third pixel electrode ELT3 may overlap a portion of each of the first and second alignment electrodes ALE1 and ALE2, but embodiments are not limited thereto.

The second pixel electrode ELT2 (also referred to as a "second electrode") may be disposed on the second end portions EP2 of the second light emitting elements LD2 and may be electrically connected to the second end portions EP2 of the second light emitting elements LD2. For example, the second pixel electrode ELT2 may be disposed (e.g., directly disposed) on the second end portions EP2 of the second light emitting elements LD2 to be in contact with the second end portions EP2 of the second light emitting elements LD2.

In an embodiment, the second pixel electrode ELT2 may overlap the third alignment electrode ALE3, and may be electrically connected to the third alignment electrode ALE3 through a fifth contact portion CNT5. For example, the second pixel electrode ELT2 may be electrically connected to the second power line PL2 through the third alignment electrode ALE3. In another example, the second pixel electrode ELT2 may be electrically connected to the second power line PL2 without passing through the third alignment electrode ALE3.

The pixel electrodes ELT (for example, the first pixel electrode ELT1, the second pixel electrode ELT2, and the third pixel electrode ELT3) may be formed in each emission area EA separately from each other. In an embodiment, at least one pixel electrode ELT may extend from each emission area EA to the non-emission area NEA and/or the separation area SPA. For example, the first pixel electrode ELT1 and the second pixel electrode ELT2 may extend from each emission area EA to the non-emission area NEA and the separation area SPA, and may be electrically connected to the first alignment electrode ALE1 and the third alignment electrode ALE3 in the separation area SPA, respectively. The third pixel electrode ELT3 may be formed only in each emission area EA, or a portion of the third pixel electrode ELT3 may be positioned in the non-emission area NEA. The position, size, shape, mutual disposition structure of the pixel electrodes ELT, the positions of the fourth and fifth contact portions CNT4 and CNT5, and/or the like may be variously changed according to embodiments.

The bank pattern layers BNP (also referred to as "pattern layers" or "wall pattern layers") may be disposed under the alignment electrodes ALE to overlap a portion of the alignment electrodes ALE. For example, the bank pattern layers BNP may include a first bank pattern layer BNP1, a second bank pattern layer BNP2, and a third bank pattern layer BNP3 overlapping a portion the first alignment electrode ALE1, the second alignment electrode ALE2, and the third alignment electrode ALE3, respectively. In an embodiment, at least one bank pattern layer BNP may extend to the non-emission area NEA around the emission area EA, but embodiments are not limited thereto.

A portion of the alignment electrodes ALE may protrude in an upper direction (for example, the third direction DR3) of the pixel PXL by the bank pattern layers BNP. Accordingly, an area in which the light emitting elements LD are aligned may be readily controlled, and light emitted at a low angle toward the bank pattern layers BNP (e.g., the bank pattern layers BNP disposed around the corresponding light emitting element LD) among the light emitted from the light emitting elements LD may be reflected in the upper direction of the pixel PXL to increase light efficiency of the pixel PXL.

In an embodiment, at least two adjacent pixels PXL may share at least one bank pattern layer BNP. For example, the second bank pattern layer BNP2 may be integral with the third bank pattern layer BNP3 of the pixel PXL adjacent in the first direction DR1 (for example, an adjacent pixel of a right side). For example, the third bank pattern layer BNP3 may be integral with the second bank pattern layer BNP2 of another pixel adjacent in the first direction DR1 (for example, an adjacent pixel of a left side). The position, structure, number, shape, and/or the like of the bank pattern layers BNP may be variously changed according to embodiments.

The non-emission area NEA may be disposed around each emission area EA and/or each separation area SPA. A first bank BNK1 may be disposed in the non-emission area NEA.

The first bank BNK1 may include a first opening OPA1 corresponding to each emission area EA, and may surround the emission area EA. For example, the first bank BNK1 may include second openings OPA2 corresponding to the separation areas SPA and may surround the separation areas SPA. For example, the first bank BNK1 may include openings OPA corresponding to each emission area EA and each separation area SPA.

The first bank BNK1 may include at least one light blocking and/or reflective material. For example, the first bank BNK1 may include at least one black matrix material, color filter material of a specific color, and/or the like. Accordingly, light leakage between adjacent pixels PXL may be prevented or minimized.

The first bank BNK1 may define each emission area EA to which the light emitting elements LD are supplied/provided in a step of supplying the light emitting elements LD to each pixel PXL. For example, as the emission areas EA of the pixels PXL are separated and partitioned by the first bank BNK1, a certain type and/or amount of a light emitting element mixture liquid may be supplied.

In an embodiment, the first bank BNK1 may include a hydrophobic surface. For example, the first bank BNK1 may be formed to have the hydrophobic surface by forming the first bank BNK1 as a hydrophobic pattern layer formed of a hydrophobic material or by forming a hydrophobic film formed of a hydrophobic material on the first bank BNK1. For example, the first bank BNK1 may be formed of a hydrophobic organic material having a large contact angle, such as polyacrylate, and thus the first bank BNK1 may be formed as a hydrophobic pattern layer. Accordingly, the light emitting element mixture liquid may stably flow into the emission area EA.

Figure 10:
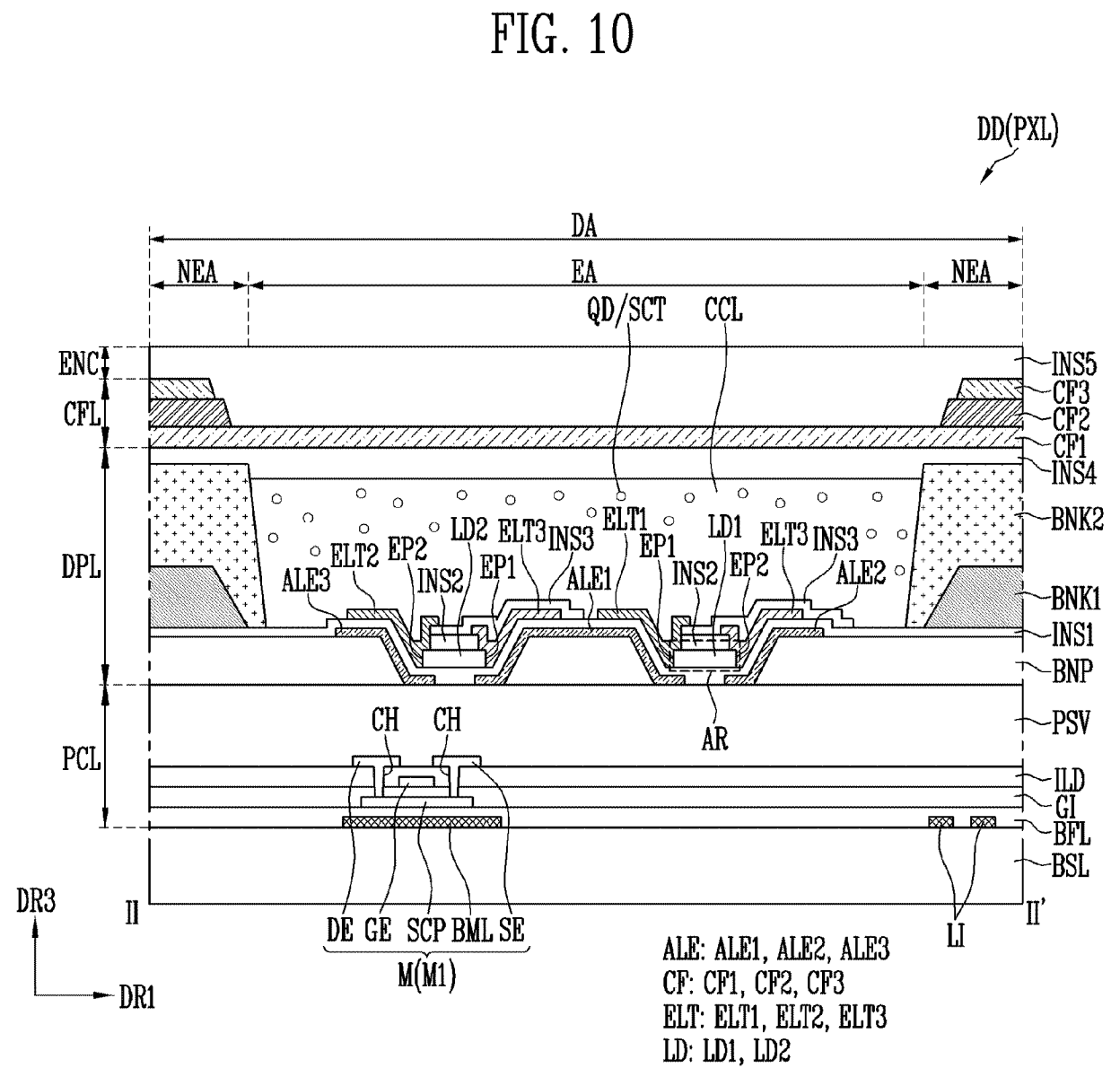

FIG. 10 is a schematic cross-sectional view illustrating an embodiment of the display device of FIG. 7. For example, FIG. 10 illustrates an embodiment of a cross section of the display device DD based on a cross section of the pixel PXL taken along line II-II' of FIG. 9.

Referring to FIGS. 1 to 10, the display device DD may include a base layer BSL, the circuit layer PCL, and a display layer DPL. The circuit layer PCL and the display layer DPL may be provided to overlap each other on the base layer BSL. For example, the circuit layer PCL and the display layer DPL may be sequentially disposed on a surface of the base layer BSL.

The display device DD may further include a color filter layer CFL and/or an encapsulation layer ENC (or a protective layer) disposed on the display layer DPL. In an embodiment, the color filter layer CFL and/or the encapsulation layer ENC may be formed (e.g., directly formed) on the surface of the base layer BSL on which the circuit layer PCL and the display layer DPL are formed, but embodiments are not limited thereto.

The base layer BSL may be a substrate or a film formed of a rigid or flexible material. In an embodiment, the base layer BSL may include at least one transparent or opaque insulating material, and may have a structure of a single layer or multiple layers.

The circuit layer PCL may be provided on the surface of the base layer BSL. The circuit layer PCL may include circuit elements forming the pixel circuit PXC of each pixel PXL. For example, circuit elements (for example, the transistors M and the capacitor Cst forming each pixel circuit PXC) may be formed in each pixel area of the circuit layer PCL.

In FIG. 10, as an example of the circuit elements that is disposed in the circuit layer PCL, any one transistor M (for example, the first transistor M1 including the lower metal layer BML) provided in each pixel circuit PXC is illustrated.

For example, the circuit layer PCL may include various signal lines and power lines connected to the pixels PXL. For example, the circuit layer PCL may include scan lines SL, sensing control lines SSL, data lines DL, sensing lines SENL, and/or first and second power lines PL1 and PL2 connected to the pixels PXL. In FIG. 10, as an example of lines that are disposed in the circuit layer PCL, lines LI positioned on the same layer (for example, a first conductive layer) as the lower metal layer BML is illustrated. Each line LI may be any one of the signal lines and the power lines connected to the pixels PXL. In an embodiment, at least one signal line and/or power line may be disposed in another layer of the circuit layer PCL.

For example, the circuit layer PCL may include insulating layers. For example, the circuit layer PCL may include a buffer layer BFL, a gate insulating layer GI, an interlayer insulating layer ILD, and/or a passivation layer PSV sequentially disposed on the surface of the base layer BSL.

The circuit layer PCL may include a first conductive layer disposed on the base layer BSL and including the lower metal layer BML of the first transistor M1. For example, the first conductive layer may be disposed between the base layer BSL and the buffer layer BFL and include the lower metal layer BML of the first transistor M1 provided in each pixel circuit PXC. The lower metal layer BML of the first transistor M1 may overlap a gate electrode GE and the semiconductor pattern layer SCP of the first transistor M1.

For example, the first conductive layer may further include at least one line LI. For example, the first conductive layer may include at least some lines LI among lines extending in the second direction DR2 in the display area DA. For example, the first conductive layer may include the sensing lines SENL and the data lines DL connected to the pixels PXL, the first power line PL1 (or a second direction first sub power line forming the first power line PL1 having a mesh shape), and/or the second power line PL2 (or a second direction second sub power line forming the second power line PL2 having a mesh shape).

The buffer layer BFL may be disposed on the surface of the base layer BSL on which the first conductive layer is formed. The buffer layer BFL may prevent an impurity from diffusing (or permeating) into each circuit element.

A semiconductor layer may be disposed on the buffer layer BFL. The semiconductor layer may include the semiconductor pattern layer SCP of each transistor M. The semiconductor pattern layer SCP may include a channel area overlapping the gate electrode GE of the corresponding transistor M, and first and second conductive areas (for example, source and drain areas) disposed on sides (e.g., opposite sides) of the channel area. The semiconductor pattern layer SCP may be a semiconductor pattern layer formed of polysilicon, amorphous silicon, an oxide semiconductor, or the like.

The gate insulating layer GI may be disposed on the semiconductor layer. For example, a second conductive layer may be disposed on the gate insulating layer GI.

The second conductive layer may include the gate electrode GE of each transistor M. For example, the second conductive layer may further include an electrode of the capacitor Cst, a bridge pattern layer, and/or the like provided in the pixel circuit PXC. For example, in case that at least one power line and/or signal line disposed in the display area DA is formed as multiple layers, the second conductive layer may further include at least one conductive pattern layer forming the at least one power line and/or signal line.

The interlayer insulating layer ILD may be disposed on the second conductive layer. For example, a third conductive layer may be disposed on the interlayer insulating layer ILD.

The third conductive layer may include a source electrode SE and a drain electrode DE of each transistor M. The source electrode SE may be connected to one area (for example, the source area) of the semiconductor pattern layer SCP included in the corresponding transistor M through at least one contact hole CH, and the drain electrode DE may be connected to another area (for example, the drain area) of the semiconductor pattern layer SCP included in the corresponding transistor M through at least another contact hole CH. For example, the third conductive layer may further include another electrode of the capacitor Cst, certain lines, a bridge pattern layer, and/or the like provided in the pixel circuit PXC. For example, the third conductive layer may include at least some lines among lines extending in the first direction DR1 in the display area DA. For example, the third conductive layer may include the scan lines SL, the sensing control lines SSL, the first power line PL1 (or a first direction first sub power line forming the first power line PL1 having the mesh shape), and/or the second power line PL2 (or a first direction second sub power line forming the second power line PL2 having the mesh shape) connected to the pixels PXL. For example, in case that at least one power line and/or signal line disposed in the display area DA is formed as multiple layers, the third conductive layer may further include at least one conductive pattern layer forming the at least one power line and/or signal line.

Each conductive pattern layer, electrode and/or line forming the first to third conductive layers may have conductivity by including at least one conductive material, and a configuration material thereof is not limited. For example, each conductive pattern layer, electrode and/or line forming the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various other types of conductive materials.

The passivation layer PSV may be disposed on the third conductive layer. Each of the buffer layer BFL, the gate insulating layer GI, the interlayer insulating layer ILD, and the passivation layer PSV may be formed as a single layer or multiple layers, and may include at least one inorganic material and/or organic material. In an embodiment, each of the buffer layer BFL, the gate insulating layer GI, and the interlayer insulating layer ILD may include various types of inorganic materials including silicon nitride ($SiN_x$), silicon oxide ($SiO_x$), silicon oxynitride (SiOxNy), or the like. In an embodiment, the passivation layer PSV may include at least one layer of organic layer including at least one organic material. In an embodiment, the passivation layer PSV may be disposed (e.g., entirely disposed) in at least the display area DA, and may planarize a surface of the circuit layer PCL.

The display layer DPL may be disposed on the passivation layer PSV.

The display layer DPL may include the light emitting unit EMU of each pixel PXL. For example, the display layer DPL may include the alignment electrodes ALE, at least one light emitting element LD, and the pixel electrodes ELT disposed in the emission area EA of each pixel PXL. In an embodiment, each light emitting unit EMU may include light emitting elements LD.

For example, the display layer DPL may further include insulating pattern layers and/or insulating layers sequentially disposed on the surface of the base layer BSL on which the circuit layer PCL is formed. For example, the display layer DPL may include the bank pattern layers BNP, a first insulating layer INS1, the first bank BNK1, a second insulating layer INS2, a third insulating layer INS3, a second bank BNK2, and/or a fourth insulating layer INS4. For example, the display layer DPL may selectively further include a light conversion layer CCL.

The bank pattern layers BNP may be provided and/or formed on the passivation layer PSV. The bank pattern layers BNP may be disposed under the alignment electrodes ALE to overlap a portion of each of the alignment electrodes ALE.

The alignment electrodes ALE may protrude in an upper direction (for example, the third direction DR3) of the pixel PXL around the light emitting elements LD by the bank pattern layers BNP. The bank pattern layers BNP and the alignment electrodes ALE thereon may form a reflective protrusion pattern layer around the light emitting elements LD. Accordingly, light efficiency of the pixel PXL may be improved.

The bank pattern layers BNP may be insulating pattern layers of a single layer or multiple layers including an inorganic material and/or an organic material. The alignment electrodes ALE may be disposed on the bank pattern layers BNP.

The alignment electrodes ALE may include at least one conductive material. For example, each alignment electrode ALE may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as poly(3,4-ethylenedioxythiophene) (PEDOT), but embodiments are not limited thereto. For example, the alignment electrodes ALE may include another conductive material such as carbon nano tube or graphene. For example, the alignment electrodes ALE may have conductivity by including at least one of various conductive materials. For example, the alignment electrodes ALE may include conductive materials identical to or different from each other.

Each alignment electrode ALE may be formed as a single layer or multiple layers. For example, each alignment electrode ALE may include a reflective electrode layer including a reflective conductive material (for example, metal), and may be formed as an electrode of a single layer or multiple layers.

The first insulating layer INS1 may be disposed on the alignment electrodes ALE. In an embodiment, the first insulating layer INS1 may include a contact hole for connecting at least one of the alignment electrodes ALE to any one pixel electrode ELT. For example, the first insulating layer INS1 may include contact holes for forming the fourth and fifth contact portions CNT4 and CNT5 of FIG. 9.

The first insulating layer INS1 may be formed as a single layer or multiple layers, and may include an inorganic material and/or an organic material. In an embodiment, the first insulating layer INS1 may include at least one type of inorganic material including silicon nitride ($SiN_x$), silicon oxide ($SiO_x$), or silicon oxynitride ($SiO_xN_y$).

As the alignment electrodes ALE are covered by the first insulating layer INS1, damage to the alignment electrodes ALE in a subsequent process may be prevented or minimized. For example, an occurrence of a short defect due to an improper connection between the alignment electrodes ALE and the light emitting elements LD may be prevented or minimized.

The first bank BNK1 may be disposed in the display area DA in which the alignment electrodes ALE and the first insulating layer INS1 are formed. The first bank BNK1 may be formed in the non-emission area NEA to surround the emission area EA of each pixel PXL.

The light emitting elements LD may be supplied to each emission area EA surrounded by the first bank BNK1. The light emitting elements LD may be aligned between the alignment electrodes ALE by the alignment signals applied to the alignment electrodes ALE (or the alignment lines before being separated into the alignment electrodes ALE of each pixel PXL). For example, in case that the pixel PXL includes the first alignment electrode ALE1 positioned at a center portion and the second and third alignment electrodes ALE2 and ALE3 positioned on sides (e.g., opposite sides) of the first alignment electrode ALE1 respectively, at least one first light emitting element LD1 may be aligned between the first alignment electrode ALE1 and the second alignment electrode ALE2, and at least one second light emitting element LD2 may be aligned between the first alignment electrode ALE1 and the third alignment electrode ALE3.

The second insulating layer INS2 may be disposed on a portion of the light emitting elements LD. In an embodiment, the second insulating layer INS2 may be disposed on a portion including a center portion of the light emitting elements LD to expose the first and second end portions EP1 and EP2 of the light emitting elements LD aligned in the emission area EA of the corresponding pixel PXL. In another example, the second insulating layer INS2 may be disposed (e.g., entirely formed) in the display area DA including the plurality of pixel areas, and may include contact holes exposing the first end portion EP1 and the second end portion EP2 of each of the light emitting elements LD. In case that the second insulating layer INS2 is formed on the light emitting elements LD, the light emitting elements LD may be stably fixed.

The second insulating layer INS2 may be formed as a single layer or multiple layers, and may include at least one inorganic material and/or organic material. For example, the second insulating layer INS2 may include various types of organic and/or inorganic materials including silicon nitride ($SiN_x$), silicon oxide ($SiO_x$), silicon oxynitride ($SiO_xN_y$), aluminum oxide ($Al_xO_y$), photoresist material, and the like.

On both end portions, for example, the first and second end portions EP1 and EP2 of the light emitting elements LD, which are not covered by the second insulating layer INS2, different pixel electrodes ELT may be disposed and/or formed. For example, the first pixel electrode ELT1 may be disposed on the first end portion EP1 of the first light emitting element LD1, and a portion of the third pixel electrode ELT3 may be disposed the second end portion EP2 of the first light emitting element LD1. Another portion of the third pixel electrode ELT3 may be disposed on the first end portion EP1 of the second light emitting element LD2, and the second pixel electrode ELT2 may be disposed on the second end portion EP2 of the second light emitting element LD2.

In an embodiment, the first pixel electrode ELT1 may be electrically connected to the first alignment electrode ALE1 through at least one contact portion (for example, the fourth contact portion CNT4 of FIG. 9). For example, the second pixel electrode ELT2 may be electrically connected to the third alignment electrode ALE3 through at least one contact portion (for example, the fifth contact portion CNT5 of FIG. 9). The third pixel electrode ELT3 may electrically connect at least one first light emitting element LD1 and at least one second light emitting element LD2 to each other.

In an embodiment, the first alignment electrode ALE1 of each pixel PXL may be electrically connected to the first transistor M1 of the corresponding pixel PXL through at least one contact portion (for example, the first contact portion CNT1 of FIG. 9). For example, the second and third alignment electrodes ALE2 and ALE3 may be electrically connected to the second power line PL2 through at least one contact portion (for example, the second contact portion CNT2 and the third contact portion CNT3 of FIG. 9).

The first pixel electrode ELT1 may be disposed on the first alignment electrode ALE1 to overlap a portion of the first alignment electrode ALE1, and the second pixel electrode ELT2 may be disposed on the third alignment electrode ALE3 to overlap a portion of the third alignment electrode ALE3. The third pixel electrode ELT3 may be disposed on the first alignment electrode ALE1 and the second alignment electrode ALE2 to overlap another portion of the first alignment electrode ALE1 and the second alignment electrode ALE2.

In an embodiment, the first pixel electrode ELT1 may be electrically connected to the first end portion EP1 of the first light emitting element LD1, and the second pixel electrode ELT2 may be electrically connected to the second end portion EP2 of the second light emitting element LD2. The third pixel electrode ELT3 may be electrically connected to the second end portion EP2 of the first light emitting element LD1 and the first end portion EP1 of the second light emitting element LD2.

The first pixel electrode ELT1, the second pixel electrode ELT2, and/or the third pixel electrode ELT3 may be formed in layers identical to or different from each other. In an embodiment, the first and second pixel electrodes ELT1 and ELT2 may be formed in layers identical to each other, and the third pixel electrode ELT3 may be formed in a layer different from that of the first and second pixel electrodes ELT1 and ELT2. For example, the first and second pixel electrodes ELT1 and ELT2 and the third pixel electrode ELT3 may be disposed on layers different from each other with the third insulating layer INS3 interposed therebetween. In another example, all of the first to third pixel electrodes ELT1 to ELT3 may be formed in the same layer. For example, the pixel PXL may not include the third insulating layer INS3. A mutual position, a formation order, and/or the like of the pixel electrodes ELT may be variously changed according to embodiments.

In case that each pixel PXL includes the light emitting unit EMU of a parallel structure except for a series structure or each pixel PXL includes a single light emitting element LD, the pixel PXL may not include the third pixel electrode ELT3. For example, the first pixel electrode ELT1 may be disposed on the first end portions EP1 of the light emitting elements LD, and the second pixel electrode ELT2 may be disposed on the second end portions EP2 of the light emitting elements LD.

The pixel electrodes ELT may include at least one conductive material. In an embodiment, the pixel electrodes ELT may include a transparent conductive material such that the light emitted from the light emitting elements LD may transmit the pixel electrode ELT.

In an embodiment, the display device DD may include the light conversion layer CCL disposed on the light emitting unit EMU of each pixel PXL. For example, the light conversion layer CCL may be provided in each emission area EA to be positioned on the light emitting elements LD of each pixel PXL.

For example, the display device DD may further include the second bank BNK2 disposed in the non-emission area NEA to overlap the first bank BNK1. The second bank BNK2 may define (or partition) each emission area EA in which the light conversion layer CCL is to be formed. In an embodiment, the second bank BNK2 may be integral with the first bank BNK1.

The second bank BNK2 may include a light blocking material including a black matrix material and/or a reflective material. The second bank BNK2 may include a material identical to or different from that of the first bank BNK1.

The light conversion layer CCL may include at least one of wavelength conversion particles (or color conversion particles) for converting a wavelength and/or a color of the light emitted from the light emitting elements LD, and light scattering particles SCT for increasing light output efficiency of the pixel PXL by scattering the light emitted from the light emitting elements LD. For example, each light conversion layer CCL may be disposed on each light emitting unit EMU. Each light conversion layer CCL may include wavelength conversion particles such as at least one type of quantum dot QD (for example, a red quantum dot, a green quantum dot, and/or a blue quantum dot) and/or light scattering particles SCT.

For example, in case that any one pixel PXL is set as a red pixel (or green pixel) and blue light emitting elements LD are provided in the light emitting unit EMU of the pixel PXL, the light conversion layer CCL including the red quantum dot (or green quantum dot) QD for converting blue light into red light (or green light) may be disposed on the light emitting unit EMU of the pixel PXL. For example, the light conversion layer CCL may further include the light scattering particles SCT.

The fourth insulating layer INS4 may be disposed on the surface of the base layer BSL on which the light emitting units EMU and/or the light conversion layers CCL of the pixels PXL are formed.

In an embodiment, the fourth insulating layer INS4 may include at least one layer of organic layer. The fourth insulating layer INS4 may be disposed (e.g., entirely disposed) in at least the display area DA, and may substantially planarize a surface of the display layer DPL. For example, the fourth insulating layer INS4 may protect the light emitting units EMU and/or the light conversion layers CCL of the pixels PXL.

The color filter layer CFL may be disposed on the fourth insulating layer INS4.

The color filter layer CFL may include color filters CF corresponding to colors of the pixels PXL. For example, the color filter layer CFL may include a first color filter CF1 disposed in the emission area EA of the first color pixel PXL1, a second color filter CF2 disposed in the emission area EA of the second color pixel PXL2, and a third color filter CF3 disposed in the emission area EA of the third color pixel PXL3. Each color filter CF may be provided on the fourth insulating layer INS4 to overlap the light emitting unit EMU of the corresponding pixel PXL.

In an embodiment, the first, second, and third color filters CF1, CF2, and CF3 may overlap each other in the non-emission area NEA. In another example, the first, second, and third color filters CF1, CF2, and CF3 may be formed to be separated from each other in the emission areas EA of each pixel PXL, and a separate light blocking pattern layer may be disposed between the first, second, and third color filters CF1, CF2, and CF3.

The encapsulation layer ENC may be disposed on the color filter layer CFL. The encapsulation layer ENC may include the fifth insulating layer INS5. In an embodiment, the fifth insulating layer INS5 may include at least one layer of organic layer including at least one organic material, and may be formed as a single layer or multiple layers. The fifth insulating layer INS5 may be formed (e.g., entirely formed) in at least the display area DA to cover the circuit layer PCL, the display layer DPL, and/or the color filter layer CFL, and may planarize a surface of the display device DD.

Figure 11:
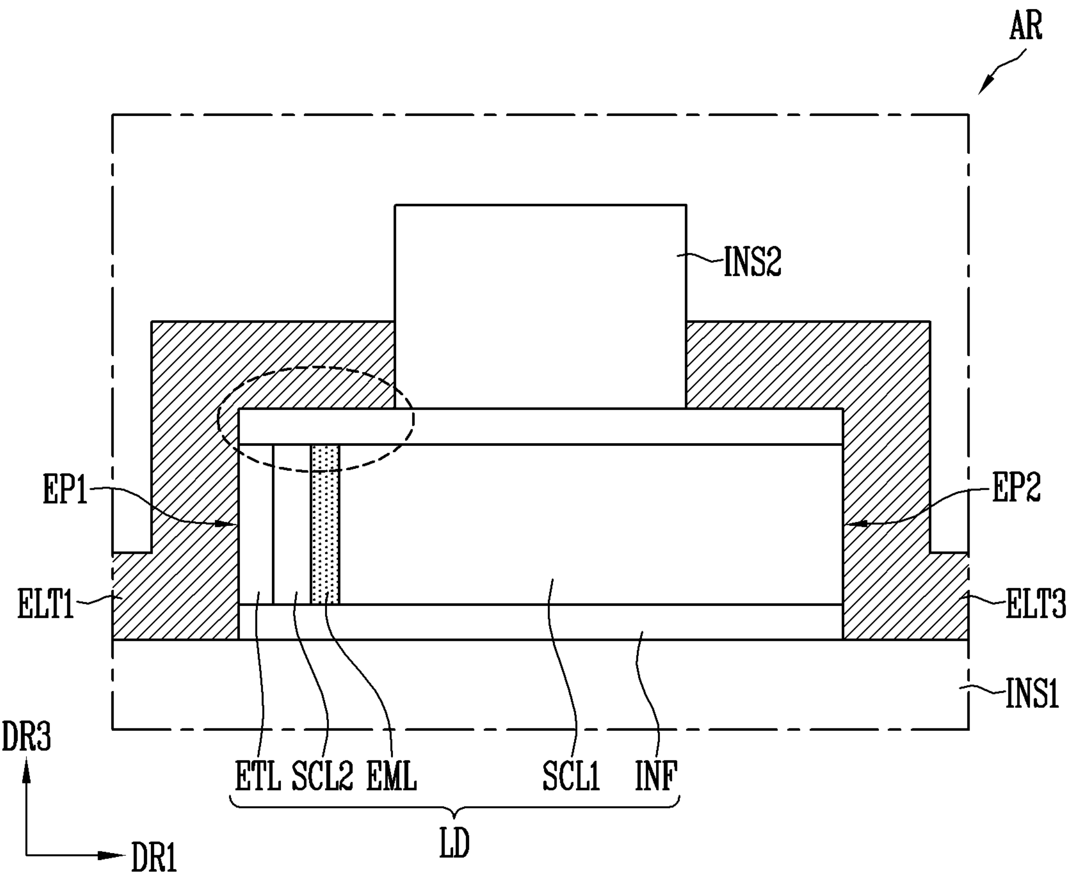
FIG. 11 is a schematic cross-sectional view illustrating an embodiment in which an area of FIG. 10 is enlarged.

FIG. 11 is a schematic cross-sectional view illustrating an embodiment in which an area of FIG. 10 is enlarged. For example, FIG. 11 is an enlarged schematic cross-sectional view of an area (for example, an area AR of FIG. 10) of the pixel PXL based on the light emitting element LD. In FIG. 11, an embodiment in which the pixel PXL of FIG. 10 includes the light emitting element LD according to the embodiments of FIGS. 1 and 2 is shown. In describing the embodiment of FIG. 11, a detailed description for configurations similar or identical to those of the previously described embodiments is omitted for descriptive convenience.

Referring to FIGS. 1, 2, 10, and 11, the light emitting element LD may be disposed on the first insulating layer INS1 (or the base layer BSL). The light emitting element LD may include the first end portion EP1 and the second end portion EP2 in a direction parallel to an upper surface of the first insulating layer INS1.

The light emitting element LD may include the first semiconductor layer SCL1, the light emitting layer EML, the second semiconductor layer SCL2, and the electrode layer ETL sequentially disposed in a direction from the second end portion EP2 to the first end portion EP1. For example, each light emitting element LD may include the insulating film INF surrounding the side surfaces of the first semiconductor layer SCL1, the light emitting layer EML, the second semiconductor layer SCL2, and the electrode layer ETL.

The second insulating layer INS2 may be disposed on a portion of the light emitting element LD. The second insulating layer INS2 may be disposed on a portion including a central portion of the light emitting element LD, and may expose the first and second end portions EP1 and EP2 of the light emitting element LD.

The first pixel electrode ELT1 may cover the first end portion EP1 of the light emitting element LD, may contact the first end portion EP1 of the light emitting element LD to which the second insulating layer INS2 is not provided and the side surface of the light emitting element LD, and may be electrically connected to the electrode layer ETL of the light emitting element LD.

The third pixel electrode ELT3 (or the second pixel electrode ELT2) may cover the second end portion EP2 of the light emitting element LD, contact the second end portion EP2 of the light emitting element LD to which the second insulating layer INS2 is not provided and the side surface of the light emitting element LD, and may be electrically connected to the first semiconductor layer SCL1 of the light emitting element LD.

The first pixel electrode ELT1 may overlap not only the electrode layer ETL of the light emitting element LD, but also the second semiconductor layer SCL2, the light emitting layer EML, and the first semiconductor layer SCL1 in the third direction DR3. An electric field may be formed between the first pixel electrode ELT1 and the first semiconductor layer SCL1 (and the light emitting layer EML or the like) overlapping each other in the third direction DR3. For example, for driving of the light emitting element LD, a driving voltage may be periodically applied to the first pixel electrode ELT1, a power voltage may be applied to the third pixel electrode ELT3, and an electric field may be formed on the side surface of the light emitting element LD that is in contact with the first pixel electrode ELT1. For example, an electron or a hole may be concentrated to the side surface of the light emitting element LD by the electric field, and a driving current flowing from the first end portion EP1 to the second end portion EP2 of the light emitting element LD and a luminance corresponding to the driving current may be reduced. For example, a characteristic of the light emitting element LD may be deteriorated.

As described with reference to FIGS. 3 to 6, the light emitting elements LD_1, LD_2, and LD_3 according to embodiments may further include the shielding layers SHL, SHL_1, and SHL_2, respectively, and the electric field may be shielded or suppressed.

Figure 12:
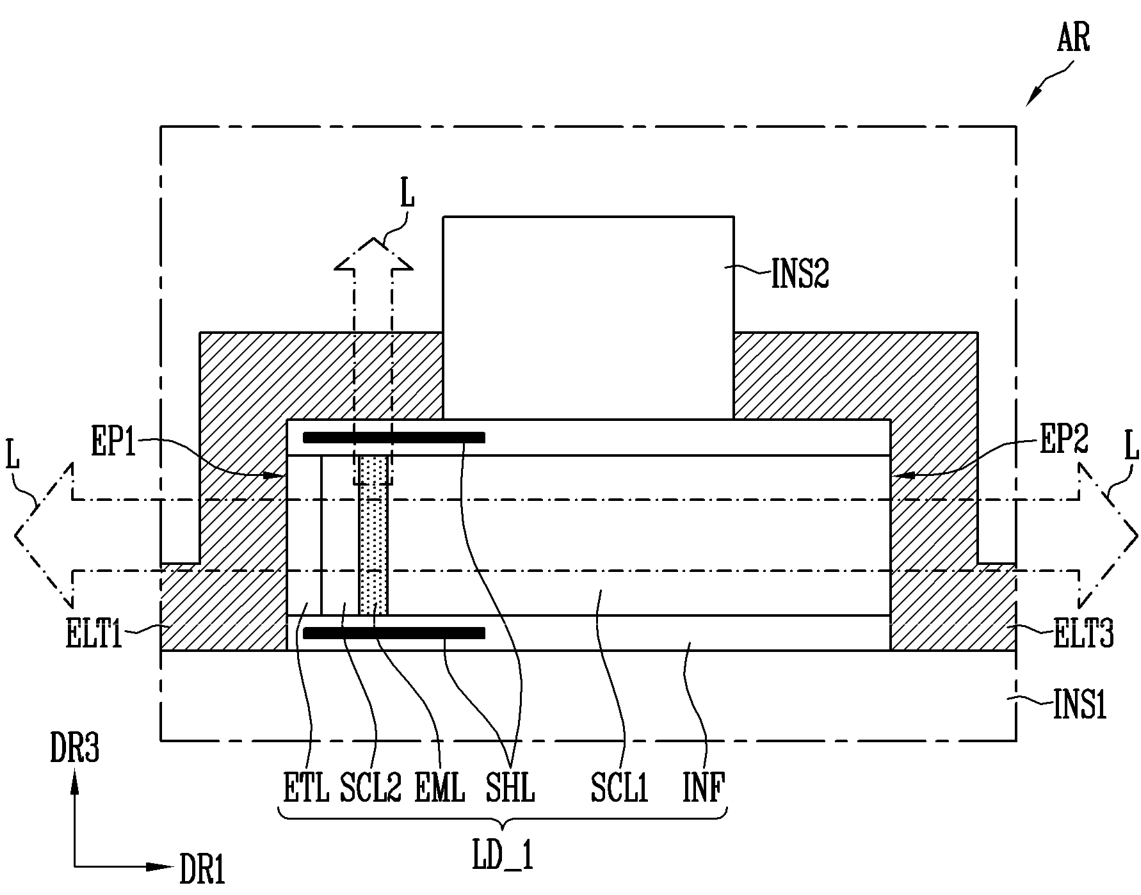
FIG. 12 is a schematic cross-sectional view illustrating an embodiment in which an area of FIG. 10 is enlarged.

FIG. 12 is a schematic cross-sectional view illustrating an embodiment in which an area of FIG. 10 is enlarged. In FIG. 12, an embodiment in which the pixel PXL of FIG. 10 includes the light emitting element LD_1 according to the embodiment of FIG. 3 is shown. In describing the embodiment of FIG. 12, a detailed description for configurations similar or identical to those of the previously described embodiments is omitted for descriptive convenience.

Referring to FIGS. 1 to 4 and 10 to 12, the light emitting element LD_1 may further include the shielding layer SHL (or the shielding film), and the shielding layer SHL may be disposed inside the insulating film INF.

The shielding layer SHL may overlap the first pixel electrode ELT1 in the third direction DR3. The shielding layer SHL may be disposed between the first pixel electrode ELT1 and a light emitting stack structure of the light emitting element LD_1 (e.g., the first semiconductor layer SCL1, the light emitting layer EML, and the second semiconductor layers SCL2, except for the insulating film INF). The shielding layer SHL may be spaced apart from the first pixel electrode ELT1 and may be in a floating state.

The shielding layer SHL may include a conductive material and may shield or suppress an electric field formed between the first pixel electrode ELT1 and the light emitting stack structure of the light emitting element LD_1. Therefore, an electron or a hole may not be concentrated on the side surface of the light emitting element LD_1, and a driving current flowing through the light emitting element LD_1 may not be reduced. For example, deterioration of the characteristic of the light emitting element LD_1 may be prevented or minimized.

In an embodiment, the light transmittance of the shielding layer SHL may be about 70% or more. For example, the light L emitted from the light emitting layer EML may proceed (or transmit) in the third direction DR3 through the shielding layer SHL. The light L emitted from the light emitting layer EML may proceed (or transmit) in a horizontal direction (the first direction DR1, or a direction opposite to the first direction DR1) through the first and second end portions EP1 and EP2.

Figure 13:
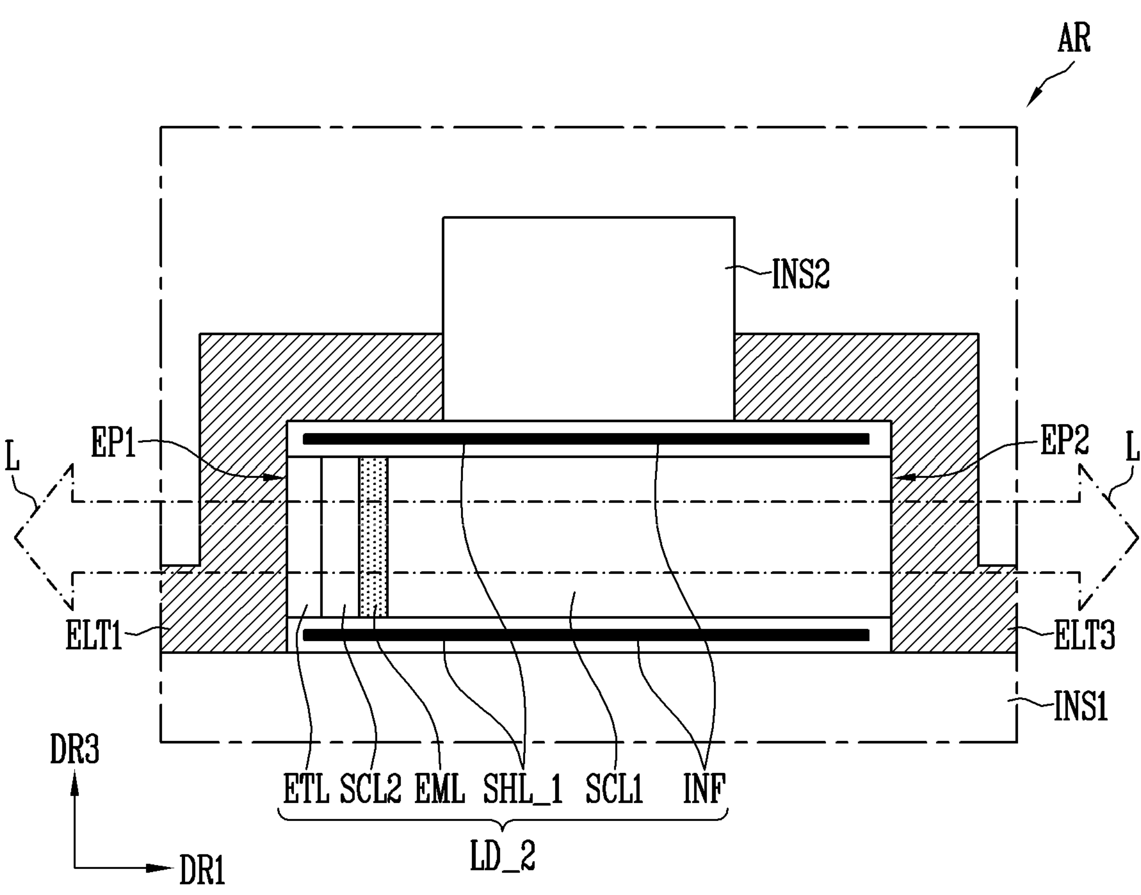
FIG. 13 is a schematic cross-sectional view illustrating an embodiment in which an area of FIG. 10 is enlarged.

FIG. 13 is a schematic cross-sectional view illustrating an embodiment in which an area of FIG. 10 is enlarged. In FIG. 13, an embodiment in which the pixel PXL of FIG. 10 includes the light emitting element LD_2 according to the embodiment of FIG. 5 is shown. In describing the embodiment of FIG. 13, a detailed description for configurations similar or identical to those of the previously described embodiments is omitted for descriptive convenience.

Referring to FIGS. 1 to 5 and 10 to 13, the light emitting element LD_2 may further include the shielding layer SHL_1.

The shielding layer SHL_1 may overlap the first pixel electrode ELT1 in the third direction DR3. For example, the shielding layer SHL_1 may overlap the third pixel electrode ELT3 in the third direction DR3. The shielding layer SHL may be disposed between the first pixel electrode ELT1 and a light emitting stack structure of the light emitting element LD_2 and between the third pixel electrode ELT3 and the light emitting stack structure of the light emitting element LD_2.

The shielding layer SHL_1 may be covered by the insulating film INF, may be spaced apart from the first pixel electrode ELT1 and the third pixel electrode ELT3, and may be in a floating state.

The shielding layer SHL_1 may shield or suppress an electric field formed between the first pixel electrode ELT1 and the light emitting stack structure of the light emitting element LD_2. For example, the shielding layer SHL_1 may shield or suppress an electric field that is formed between the third pixel electrode ELT3 and the light emitting stack structure of the light emitting element LD_2. Therefore, an electron or a hole may not be concentrated on the side surface of the light emitting element LD_2, and a driving current flowing through the light emitting element LD_2 may not be reduced. For example, deterioration of the characteristic of the light emitting element LD_2 may be prevented or minimized.

In an embodiment, the light reflectance of the shielding layer SHL_1 may be about 90% or more. For example, the light L emitted from the light emitting layer EML may be reflected (or totally reflected) by the shielding layer SHL_1, and may proceed (or transmit) to the outside of the light emitting element LD_2 through the first end portion EP1 and the second end portion EP2. For example, light emission efficiency of the light emitting element LD_2 through the first end portion EP1 and the second end portion EP2 may be improved.

Figure 14:
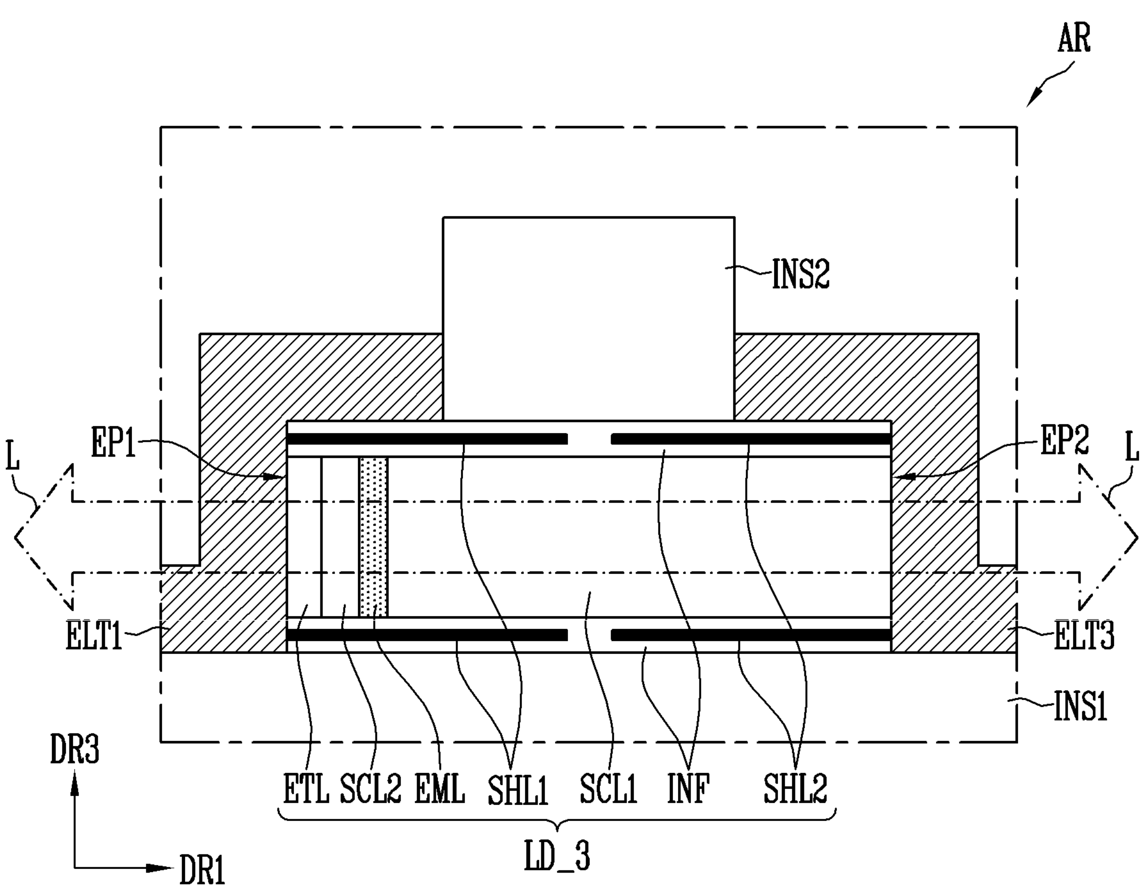
FIG. 14 is a schematic cross-sectional view illustrating an embodiment in which an area of FIG. 10 is enlarged.

FIG. 14 is a schematic cross-sectional view illustrating an embodiment in which an area of FIG. 10 is enlarged. In FIG. 14, an embodiment in which the pixel PXL of FIG. 10 includes the light emitting element LD_3 according to the embodiment of FIG. 6 is shown. In describing the embodiment of FIG. 14, a detailed description for configurations similar or identical to those of the previously described embodiments is omitted for descriptive convenience.

Referring to FIGS. 1 to 6 and 10 to 14, the light emitting element LD_3 may include the first shielding layer SHL1 (or the first shielding layer) and the second shielding layer SHL2 (or the second shielding layer) spaced apart from each other. For example, the light L emitted from the light emitting layer EML may be reflected (or totally reflected) by the first shielding layer SHL1 and the second shielding layer SHL2, and may proceed (or transmit) outside the light emitting element LD_3 through the first end portion EP1 and the second end portion EP2.

The first shielding layer SHL1 may overlap the first pixel electrode ELT1 in the third direction DR3. The first shielding layer SHL1 may be disposed between the first pixel electrode ELT1 and a light emitting stack structure of the light emitting element LD_3. The first shielding layer SHL1 may be electrically connected to the first pixel electrode ELT1.

The second shielding layer SHL2 may overlap the third pixel electrode ELT3 in the third direction DR3. The second shielding layer SHL2 may be disposed between the third pixel electrode ELT3 and the light emitting stack structure of the light emitting element LD_3. The second shielding layer SHL2 may be electrically connected to the third pixel electrode ELT3.

The first shielding layer SHL1 may shield or suppress an electric field formed between the first pixel electrode ELT1 and the light emitting stack structure of the light emitting element LD_3. The second shielding layer SHL2 may shield or suppress an electric field that is formed between the third pixel electrode ELT3 and the light emitting stack structure of the light emitting element LD_3. Therefore, deterioration of a characteristic of the light emitting element LD_3 may be prevented or minimized.

In an embodiment, at least one of the first shielding layer SHL1 and the second shielding layer SHL2 may be electrically connected to the ground (or a ground electrode). Referring to FIG. 8, for example, a ground voltage may be periodically applied to the sensing line SENL and the third transistor M3 may be turned on. As another example, the ground voltage may be periodically applied to the second power line PL2.

Figure 15:
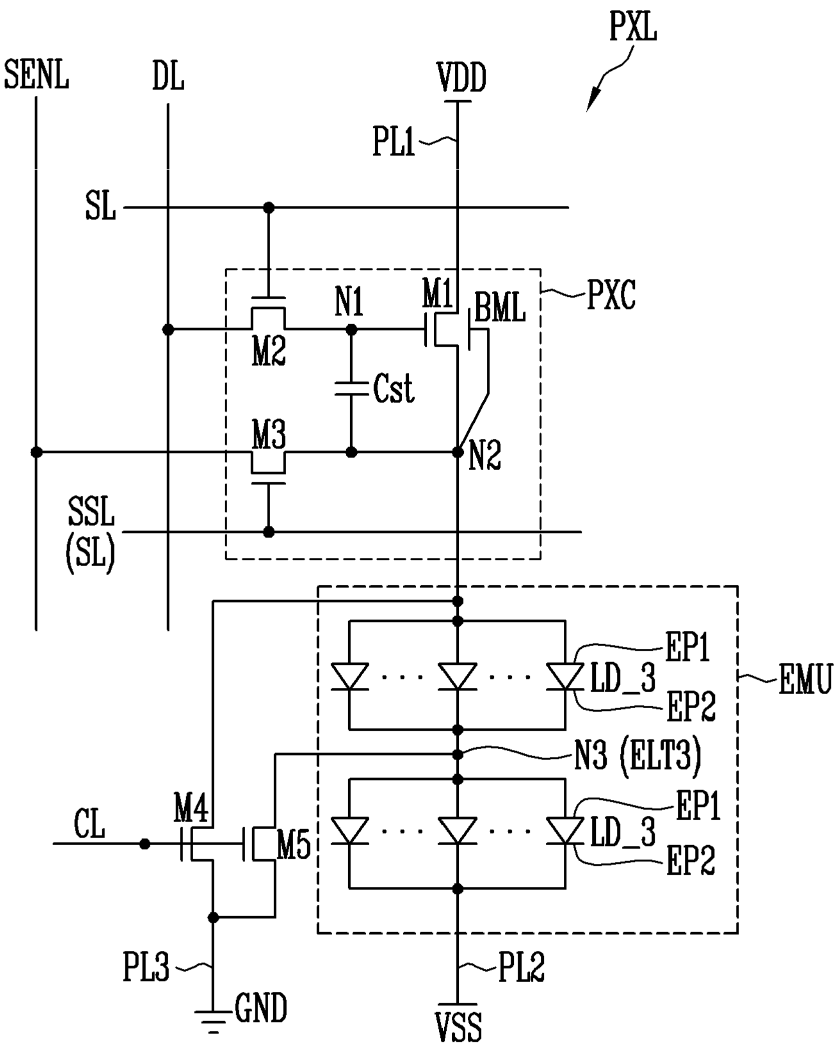
FIG. 15 is a schematic diagram of an equivalent circuit illustrating an embodiment of the pixel included in the display device of FIG. 7.

FIG. 15 is a schematic diagram of an equivalent circuit illustrating an embodiment of the pixel included in the display device of FIG. 7. In describing the embodiment of FIG. 15, a detailed description for configurations similar or identical to those of the embodiment of FIG. 8 is omitted for descriptive convenience.

Referring to FIGS. 8, 9, 14, and 15, the pixel PXL may include the light emitting element LD_3 according to the embodiment of FIG. 6. For example, the pixel PXL may further include a fourth transistor M4 and a fifth transistor M5. The fourth transistor M4 and the fifth transistor M5 may be included in the pixel circuit PXC.

The fourth transistor M4 may be connected between a second node N2 and a third power line PL3. Here, the third power line PL3 may be connected to ground, or a ground voltage GND may be applied to the third power line PL3. A gate electrode of the fourth transistor M4 may be connected to a control line CL. The fourth transistor M4 may be turned on in case that a gate-on voltage is supplied from the control line CL, to electrically connect the third power line PL3 to the second node N2. For example, the first shielding layer SHL1 of FIG. 14 of the light emitting element LD_3 in a first series stage may be connected to the ground through the second node N2.

The fifth transistor M5 may be connected between a third node N3 and the third power line PL3. Here, the third node N3 may be a node to which the first series stage and a second series stage are connected, and may correspond to a third pixel electrode ELT3 of FIG. 9. A gate electrode of the fifth transistor M5 may be connected to the control line CL. The fifth transistor M5 may be turned on in case that the gate-on voltage is supplied from the control line CL, to connect the third power line PL3 to the third node N3. For example, the second shielding layer SHL2 of FIG. 14 of the light emitting element LD_3 in the first series stage and the first shielding layer SHL1 of FIG. 14 of the light emitting element LD_3 in the second series stage may be connected to the ground through the third node N3 (or the third pixel electrode ELT3).

The second shielding layer SHL2 of FIG. 14 of the light emitting element LD_3 in the second series stage may be connected to the ground through the second power line PL2. In another example, the second shielding layer SHL2 of FIG. 14 of the light emitting element LD_3 in the second series stage may be connected to the ground through a separate transistor connected to the second power line PL2.

As described above, the pixel PXL may further include the fourth and fifth transistors M4 and M5 for connecting the first and second shielding layers SHL1 and SHL2 of the light emitting element LD_3 to the ground.

Figure 16:
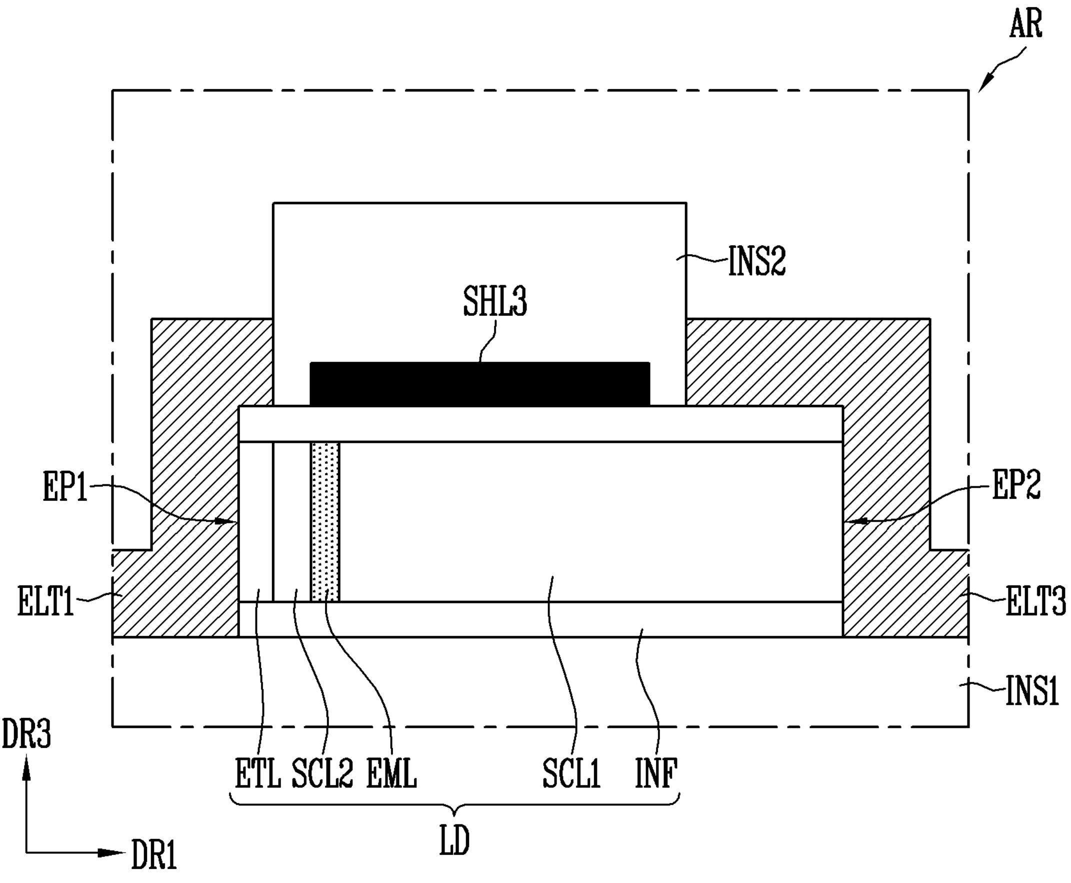
FIGS. 16, 17, and 18 are schematic cross-sectional views illustrating an embodiment of the pixel of FIG. 15.
Figure 17:
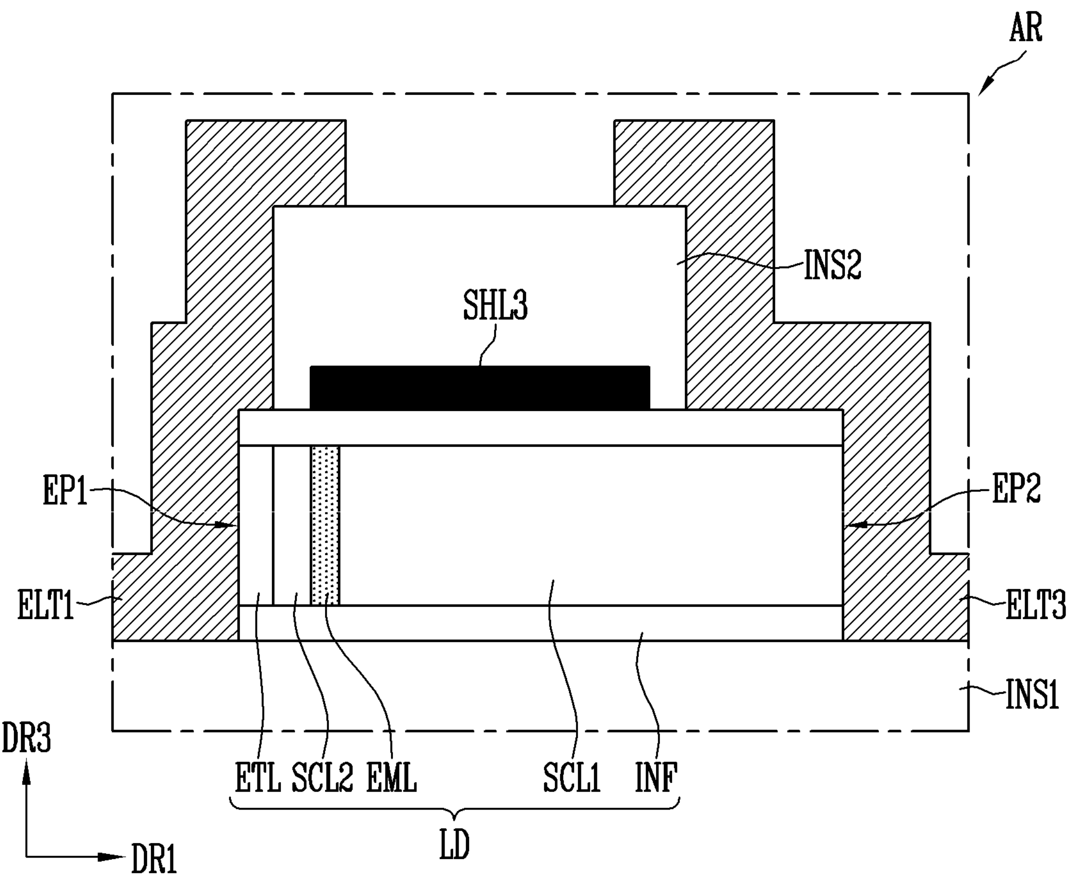
Figure 18:
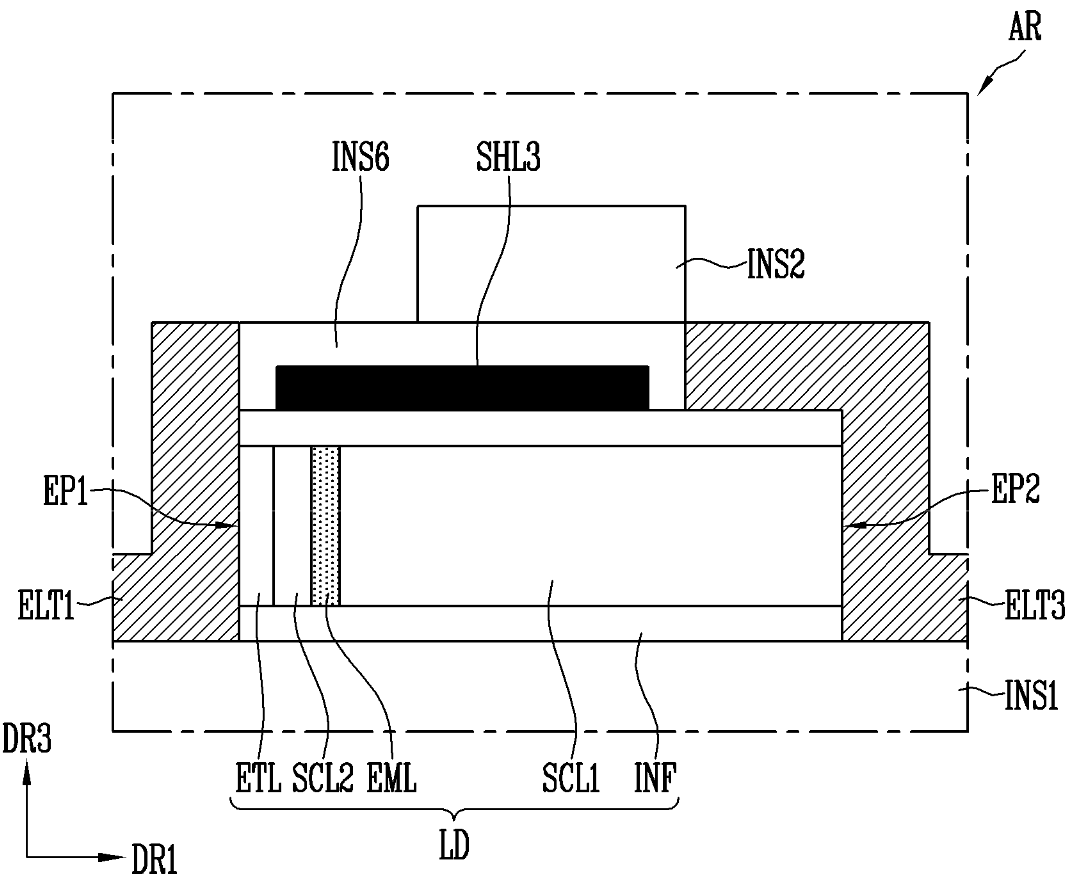

FIGS. 16, 17, and 18 are schematic cross-sectional views illustrating an embodiment of the pixel of FIG. 15. In FIGS. 16, 17, and 18, an embodiment in which the pixel PXL of FIG. 10 includes the light emitting element LD according to the embodiment of FIGS. 1 and 2 is shown. However, embodiments are not limited thereto, and the pixel PXL may include one of the light emitting elements LD_1, LD_2, and LD_3 according to the embodiments of FIGS. 3 to 6. In describing the embodiments of FIGS. 16, 17, and 18, a detailed description of configurations similar or identical to those of the previous embodiments is omitted for descriptive convenience.

Referring to FIGS. 1 to 11, 16, and 17, a third shielding layer SHL3 may be disposed on the side surface (or the circumferential surface) of the light emitting element LD. The third shielding layer SHL3 may be disposed between the light emitting element LD and the second insulating layer INS2.

The third shielding layer SHL3 may overlap the light emitting layer EML of the light emitting element LD in the third direction DR3. For example, the third shielding layer SHL3 may overlap the first semiconductor layer SCL1 in the third direction DR3. According to an embodiment, the third shielding layer SHL3 may overlap the second semiconductor layer SCL2 in the third direction DR3.

The third shielding layer SHL3 may be disposed between the first pixel electrode ELT1 and the light emitting element LD. For example, as shown in FIG. 17, in case that the first pixel electrode ELT1 is also disposed on the second insulating layer INS2, the third shielding layer SHL3 may be disposed between the first pixel electrode ELT1 and the light emitting element LD based on the third direction DR3.

The third shielding layer SHL3 may be spaced apart from the first pixel electrode ELT1. In order to electrically separate (or insulate) the first pixel electrode ELT1 and the third shielding layer SHL3, the second insulating layer INS2 covering the third shielding layer SHL3 may be biased (or shifted) toward the first end portion EP1 of the light emitting element LD than the second end portion EP2 of the light emitting element LD. However, a disposition of the second insulating layer INS2 is not limited thereto. According to an embodiment, the third shielding layer SHL3 may be disposed between the third pixel electrode ELT3 and the light emitting element LD, and the third shielding layer SHL3 may be spaced apart from the third pixel electrode ELT3.

The third shielding layer SHL3 may be electrically separated or insulated from the first pixel electrode ELT1 and the third pixel electrode ELT3. The third shielding layer SHL3 may be in a floating state, but embodiments are not limited thereto. For example, a positive voltage or a ground voltage may be applied to the third shielding layer SHL3.

The third shielding layer SHL3 may include a conductive material and may shield or suppress an electric field formed between the first pixel electrode ELT1 and the light emitting stack structure of the light emitting element LD. For example, the third shielding layer SHL3 may shield or suppress an electric field that is formed between the third pixel electrode ELT3 and the light emitting element LD. Therefore, an electron or a hole may not be concentrated on the side surface of the light emitting element LD, and the driving current flowing through the light emitting element LD may not be reduced. For example, deterioration of the characteristic of the light emitting element LD may be prevented or minimized.

In an embodiment, the light transmittance of the third shielding layer SHL3 may be about 70% or more. For example, light emitted from the light emitting element LD may proceed (or transmit) in the third direction DR3 through the third shielding layer SHL3. For example, the third shielding layer SHL3 may include a transparent material (or a transparent conductive material), but a material of the third shielding layer SHL3 is not limited thereto.

For example, the light transmittance of the third shielding layer SHL3 is not limited to about 70% or more. For example, in case that light emission through the side surface of the light emitting element LD is unnecessary according to a specification of the display device DD, the light transmittance of the third shielding layer SHL3 may be about 70% or less. For example, the third shielding layer SHL3 may include a reflective material or a light blocking material.

As described above, instead the light emitting element LD includes the shielding layer, the pixel PXL (or the display device DD) may include the third shielding layer SHL3 disposed on the side surface (or the circumferential surface) of the light emitting element LD (or disposed between the first pixel electrode ELT1 and the light emitting element LD), and may shield or suppress an electric field formed on the side surface of the light emitting element LD.

In FIGS. 16 and 17, the second insulating layer INS2 may cover the third shielding layer SHL3, but embodiments are not limited thereto.

Referring to FIGS. 10 and 18, the pixel PXL may further include a sixth insulating layer INS6, and the sixth insulating layer INS6 may be disposed between the second insulating layer INS2 and the light emitting element LD and may cover the third shielding layer SHL3. The second insulating layer INS2 may be disposed on the sixth insulating layer INS6.

The sixth insulating layer INS6 may electrically separate (or insulate) the third shielding layer SHL3 and the first pixel electrode ELT1 (or the third pixel electrode ELT3). The second insulating layer INS2 may be disposed between the first pixel electrode ELT1 and the third pixel electrode ELT3 to electrically separate (or insulate) the first pixel electrode ELT1 and the third pixel electrode ELT3.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A light emitting element comprising:
a first semiconductor layer;
a light emitting layer disposed on the first semiconductor layer;
a second semiconductor layer disposed on the light emitting layer;
an electrode layer disposed on the second semiconductor layer;
an insulating film covering side surfaces of the first semiconductor layer, the light emitting layer, the second semiconductor layer, and the electrode layer; and
a shielding layer disposed inside the insulating film, wherein
a light transmittance of the shielding layer is equal to or greater than about 70%, and
light emitted from the light emitting layer transmits through the shielding layer.

2. The light emitting element according to claim 1, wherein the shielding layer is spaced apart from the first semiconductor layer, the light emitting layer, the second semiconductor layer, and the electrode layer.

3. The light emitting element according to claim 1, wherein the shielding layer surrounds the side surface of the light emitting layer.

4. The light emitting element according to claim 3, wherein
the shielding layer entirely surrounds the side surfaces of the light emitting layer and the second semiconductor layer, and partially surrounds the side surface of the first semiconductor layer.

5. The light emitting element according to claim 4, wherein the shielding layer comprises:
a first shielding layer surrounding the side surfaces of the second semiconductor layer and the light emitting layer; and
a second shielding layer partially surrounding the side surface of the first semiconductor layer and spaced apart from the first shielding layer.

6. The light emitting element according to claim 5, wherein
the second shielding layer extends to an end portion of the insulating film adjacent to a lower surface of the first semiconductor layer and is exposed outside the light emitting element, and
the first shielding layer extends to another end portion of the insulating film adjacent to an upper surface of the electrode layer and is exposed outside the light emitting element.

7. The light emitting element according to claim 1, wherein
the shielding layer includes a metal, and
a thickness of the shielding layer is equal to or smaller than about 5 nm.

8. A display device comprising:
a light emitting element disposed on a substrate and including a first end portion and a second end portion arranged in a direction parallel to an upper surface of the substrate;
a first electrode electrically connected to the first end portion of the light emitting element; and
a second electrode electrically connected to the second end portion of the light emitting element,
wherein the light emitting element comprises:
a first semiconductor layer, a light emitting layer, a second semiconductor layer, and an electrode layer sequentially disposed along a longitudinal direction from the second end portion to the first end portion;
an insulating film covering side surfaces of the first semiconductor layer, the light emitting layer, the second semiconductor layer, and the electrode layer, the insulating film extending in parallel to the longitudinal direction; and
a shielding layer disposed inside the insulating film.

9. The display device according to claim 8, wherein the shielding layer is spaced apart from the first semiconductor layer, the light emitting layer, the second semiconductor layer, the electrode layer, the first electrode, and the second electrode.

10. The display device according to claim 8, wherein
the shielding layer surrounds the side surface of the light emitting layer, and
the shielding layer overlaps the first electrode in a plan view.

11. The display device according to claim 10, wherein
a light transmittance of the shielding layer is equal to or greater than about 70%, and
light emitted from the light emitting layer transmits through the shielding layer.

12. The display device according to claim 11, wherein
the shielding layer includes a metal, and
a thickness of the shielding layer is equal to or smaller than about 5 nm.

13. The display device according to claim 10, wherein
the shielding layer entirely surrounds the side surfaces of the light emitting layer and the second semiconductor layer, and partially surrounds the side surface of the first semiconductor layer,
a light reflectance of the shielding layer is equal to or greater than about 90%, and
light emitted from the light emitting layer is reflected by the shielding layer and transmits outside the light emitting element through the first end portion and the second end portion.

14. The display device according to claim 13, wherein the shielding layer comprises:
a first shielding layer surrounding the side surfaces of the second semiconductor layer and the light emitting layer; and
a second shielding layer partially surrounding the side surface of the first semiconductor layer and spaced apart from the first shielding layer.

15. The display device according to claim 14, wherein
the first shielding layer extends to the first end portion and is electrically connected to the first electrode, and
the second shielding layer extends to the second end portion and is electrically connected to the second electrode.

16. A display device comprising:
a light emitting element disposed on a first insulating layer and including a first end portion and a second end portion;
a second insulating layer disposed on the light emitting element and exposing the first end portion and the second end portion of the light emitting element;
a first electrode disposed on the first end portion of the light emitting element;
a second electrode disposed on the second end portion of the light emitting element; and a shielding layer disposed between the second insulating layer and the light emitting element and electrically separated from the first electrode and the second electrode.

17. The display device according to claim 16, wherein the shielding layer is in a floating state.

18. The display device according to claim 16, wherein a light transmittance of the shielding layer is equal to or greater than about 70%, and light emitted from the light emitting element transmits through the shielding layer.

19. The display device according to claim 16, further comprising:

a third insulating layer disposed between the shielding layer and the second insulating layer and covering the shielding layer.

* * * * *